(12) United States Patent
Chen

(10) Patent No.: US 10,916,518 B2
(45) Date of Patent: Feb. 9, 2021

(54) ELECTRICAL BINDING STRUCTURE AND METHOD OF FORMING THE SAME

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/390,018

(22) Filed: Apr. 22, 2019

(65) Prior Publication Data

US 2020/0335464 A1 Oct. 22, 2020

(51) Int. Cl.
*H01L 23/00* (2006.01)
*H01L 23/495* (2006.01)

(52) U.S. Cl.
CPC ........ *H01L 24/08* (2013.01); *H01L 23/49541* (2013.01); *H01L 24/03* (2013.01); *H01L 24/29* (2013.01); *H01L 24/32* (2013.01); *H01L 2224/05* (2013.01); *H01L 2224/26* (2013.01); *H01L 2224/32* (2013.01)

(58) Field of Classification Search
CPC ...... H01L 24/08; H01L 24/29; H01L 2224/05
See application file for complete search history.

(56) References Cited

U.S. PATENT DOCUMENTS

2004/0169249 A1* 9/2004 Parsons .................... G01K 7/16
257/468
2018/0158706 A1* 6/2018 Hsu .................... G01R 31/2887

* cited by examiner

*Primary Examiner* — Farun Lu
(74) *Attorney, Agent, or Firm* — CKC & Partners Co., LLC

(57) ABSTRACT

An electrical binding structure is provided, which includes a substrate, a contact pad set, and a combination of a micro device and an electrode. The contact pad set is on the substrate in which the contact pad set includes at least one contact pad, and the at least one contact pad is conductive. The combination is on the contact pad set. Opposite sides of the electrode are respectively in contact with the micro device and the contact pad set in which at least the contact pad set and the electrode define at least one volume space. A vertical projection of the at least one volume space on the substrate is overlapped with a vertical projection of one of the contact pad set and the electrode on the substrate, and is enclosed by a vertical projection of an outer periphery of the micro device on the substrate.

6 Claims, 28 Drawing Sheets

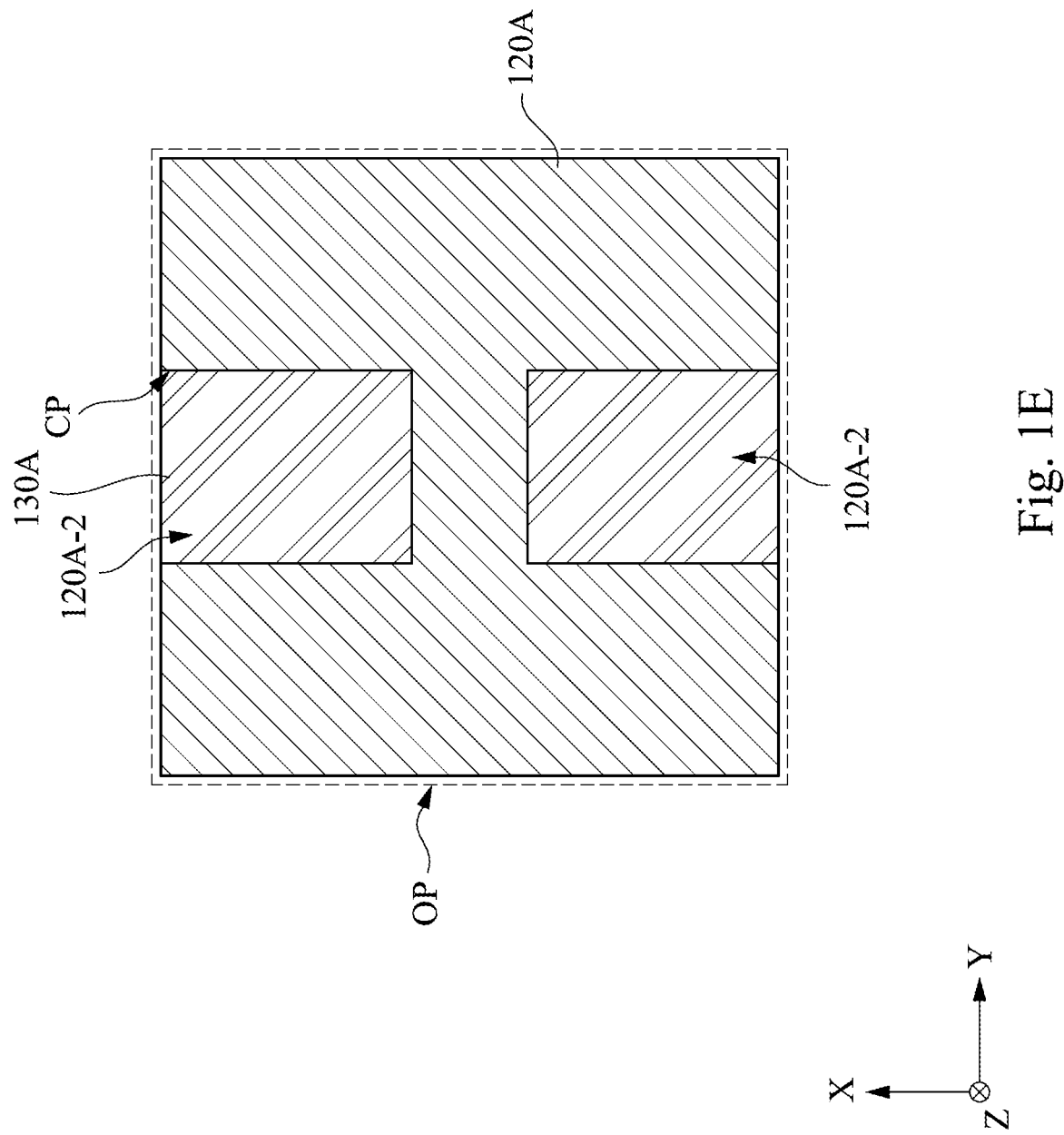

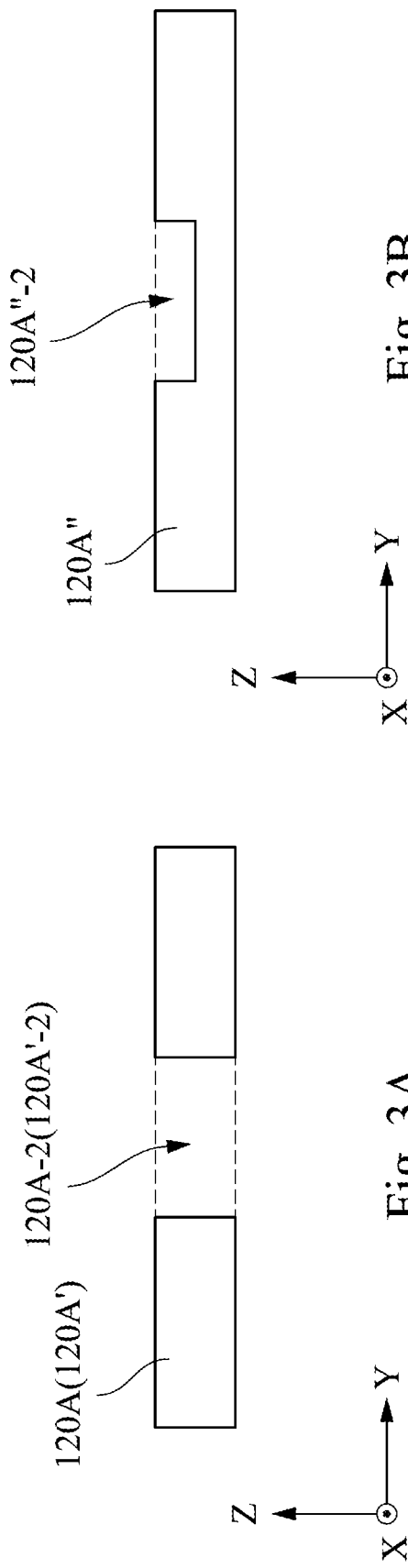
Fig. 3A
Fig. 3B
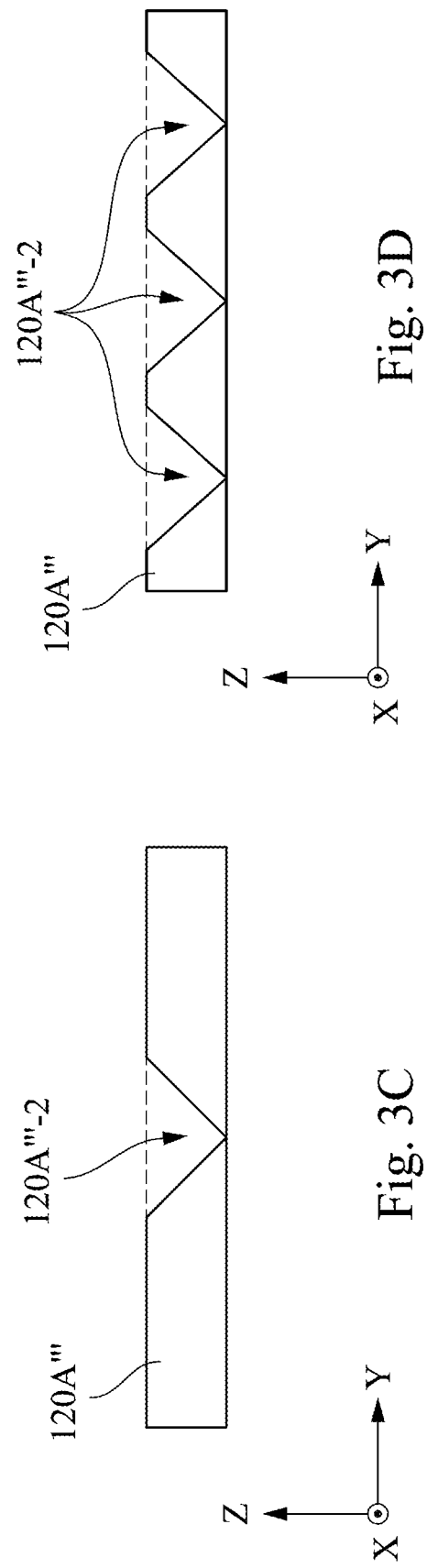
Fig. 3C
Fig. 3D

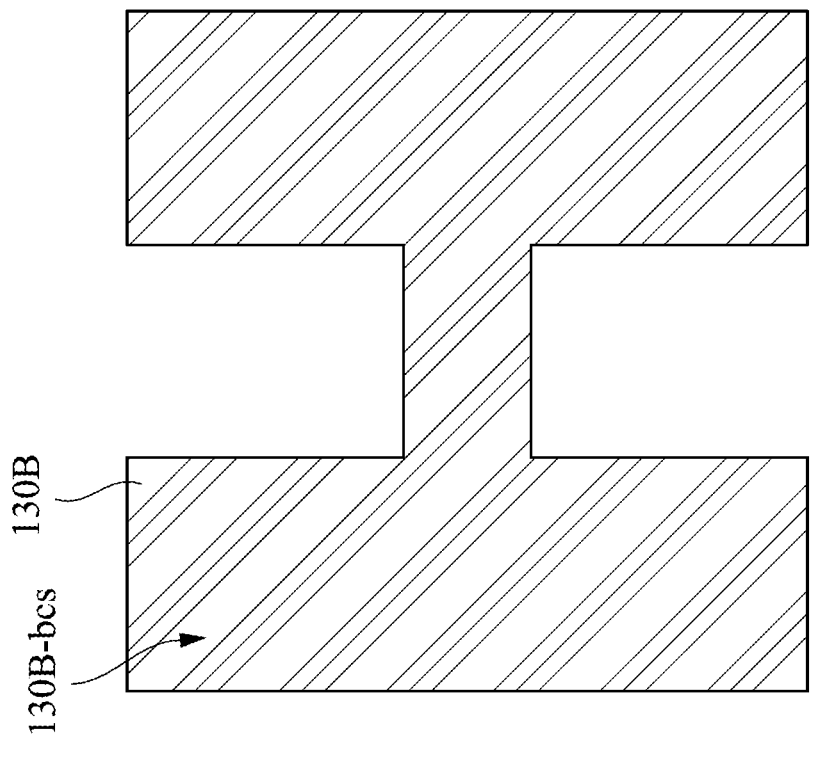
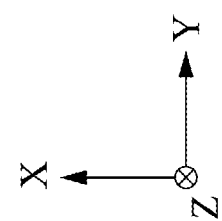
Fig. 4C
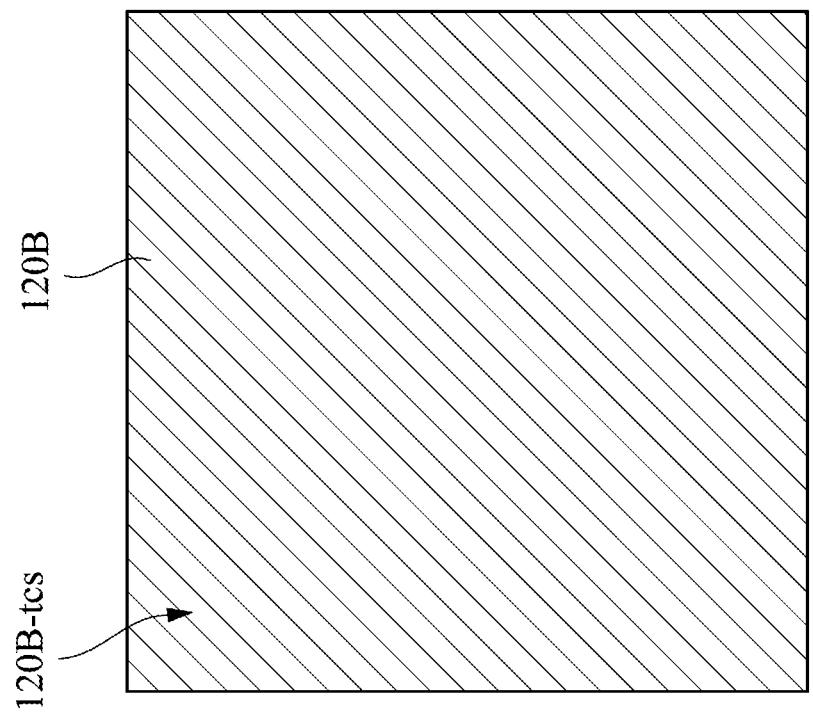
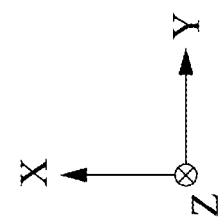
Fig. 4B

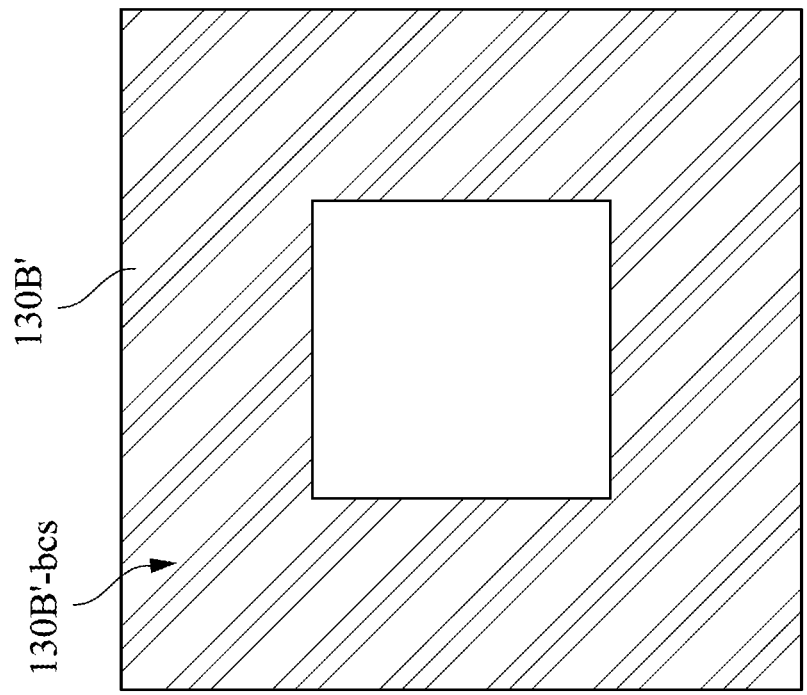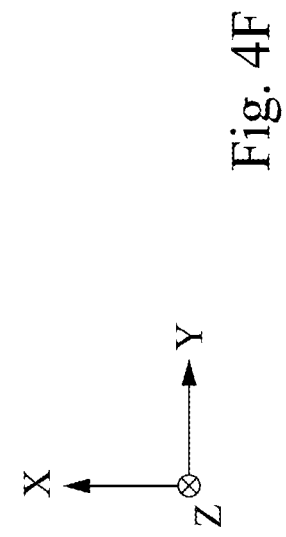
Fig. 4F
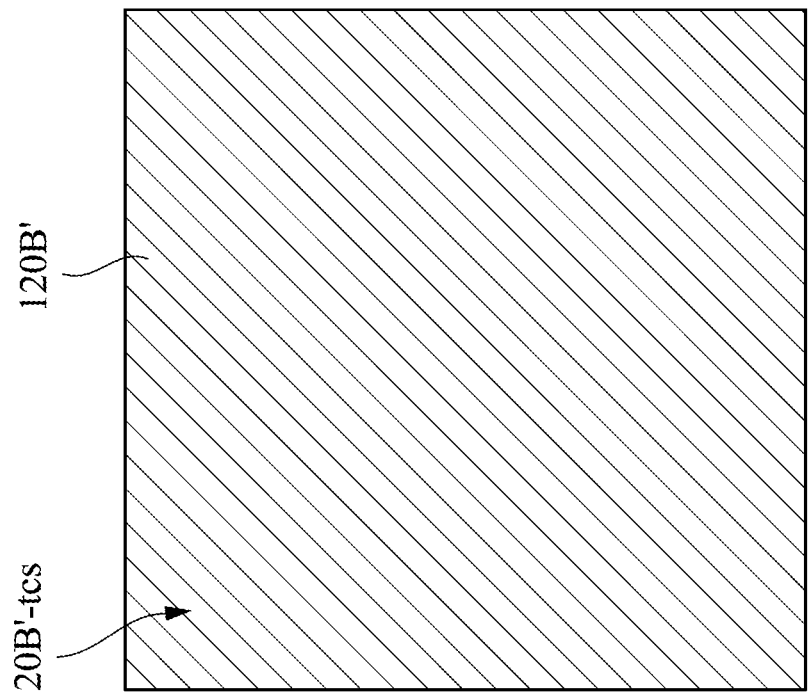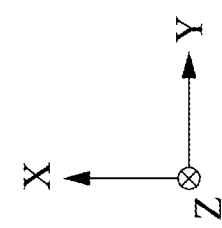
Fig. 4E

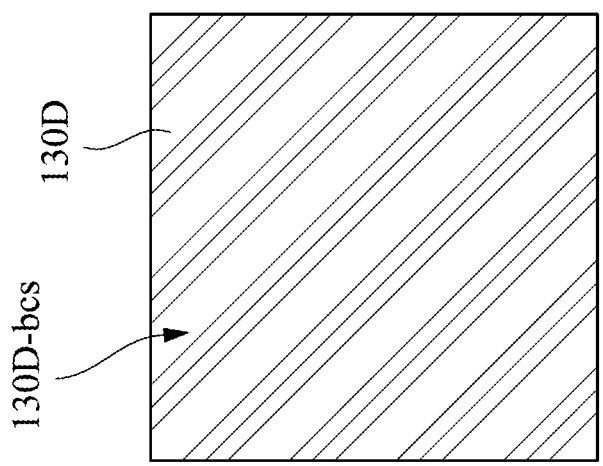
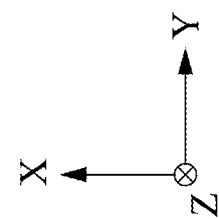
Fig. 6B
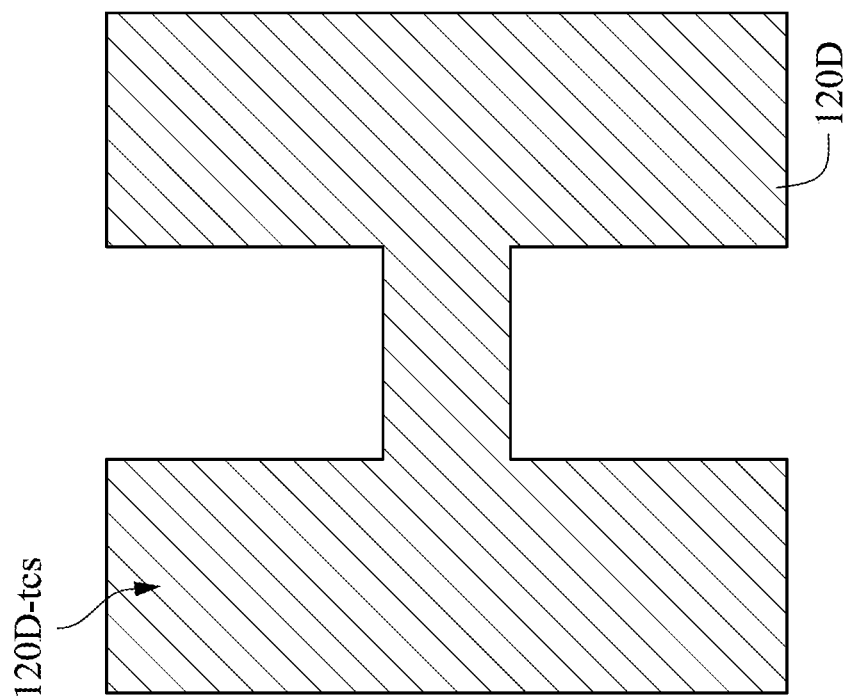
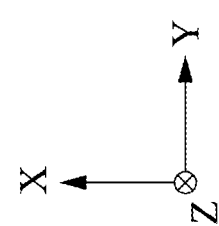
Fig. 6A

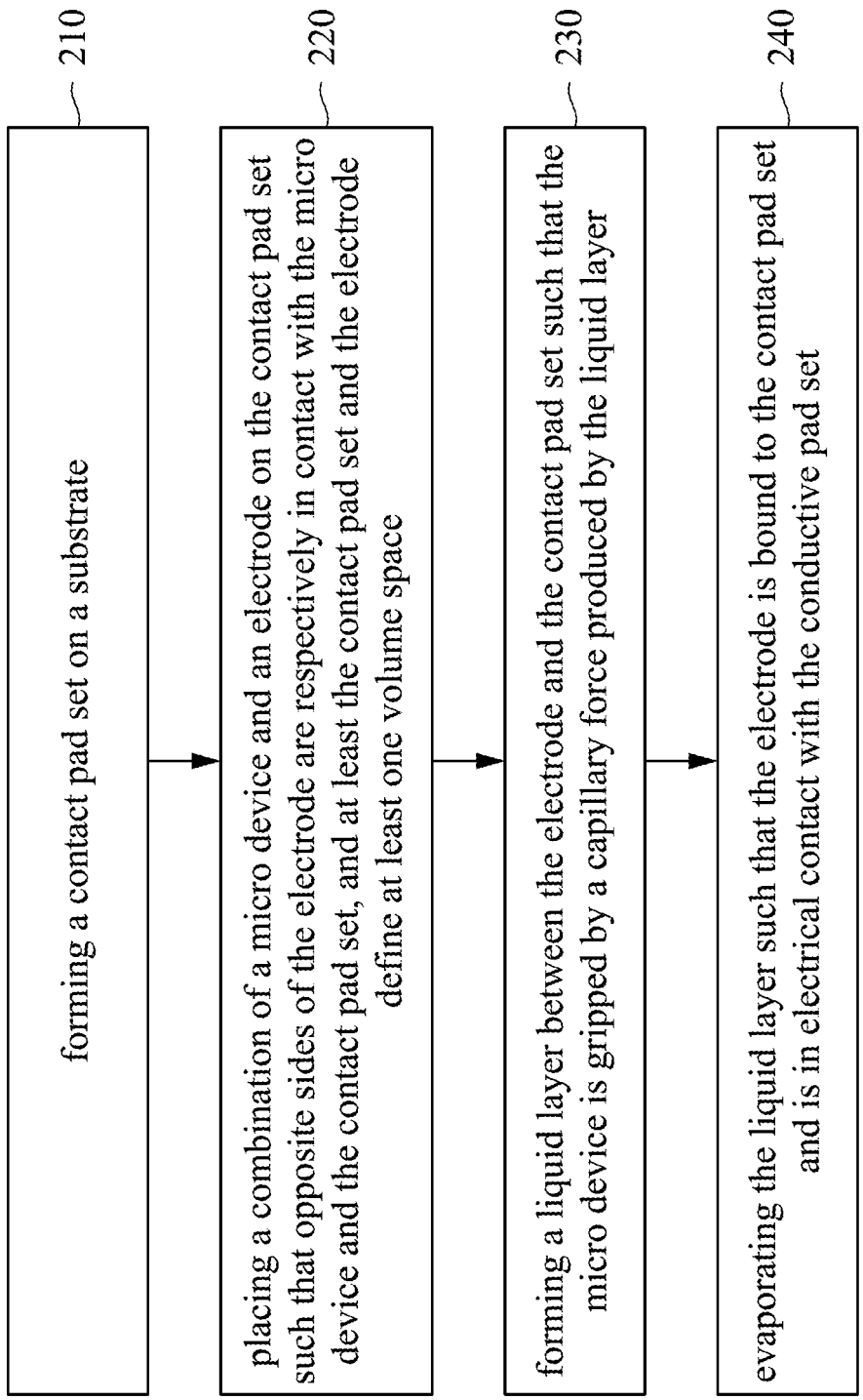

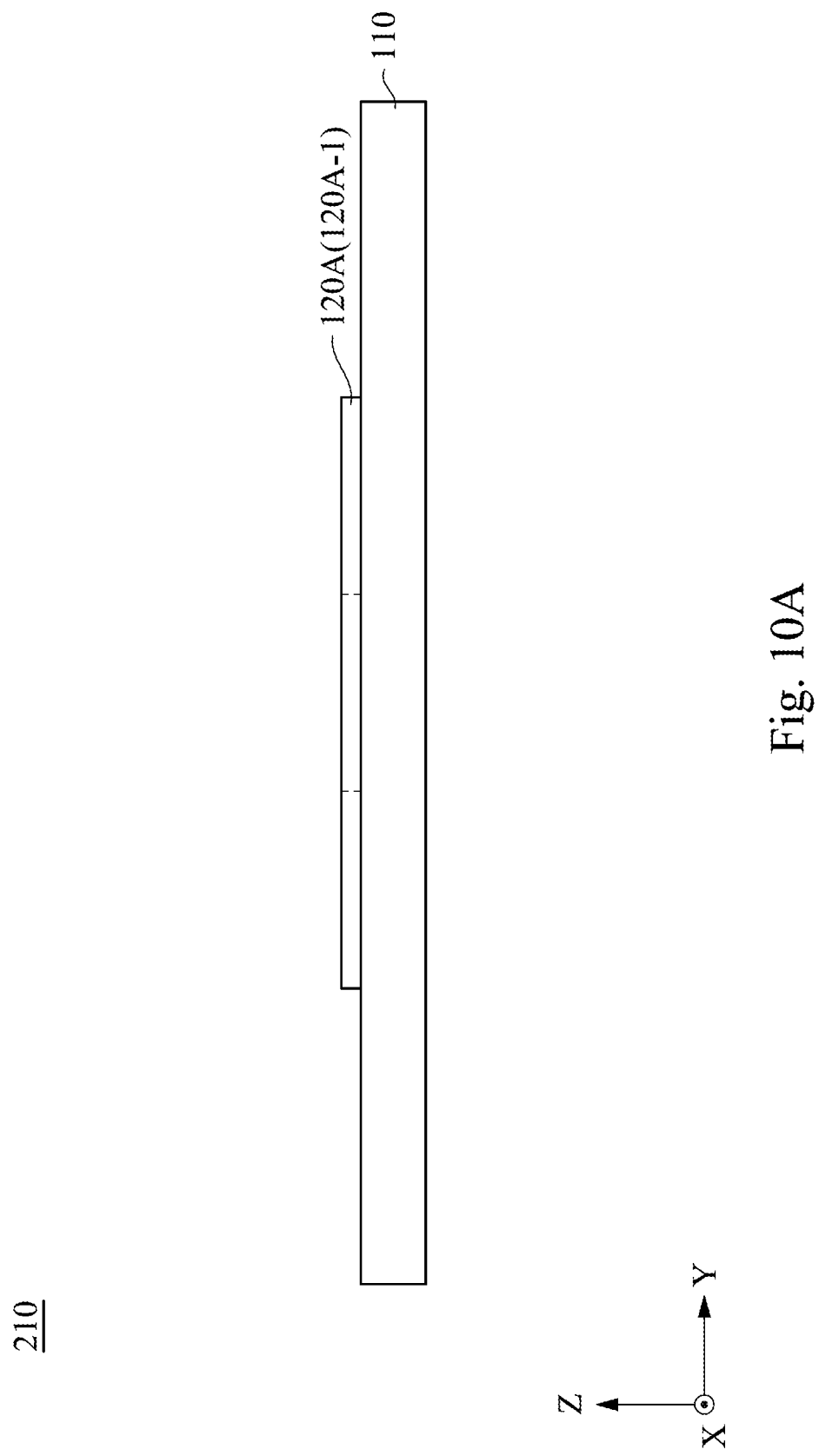

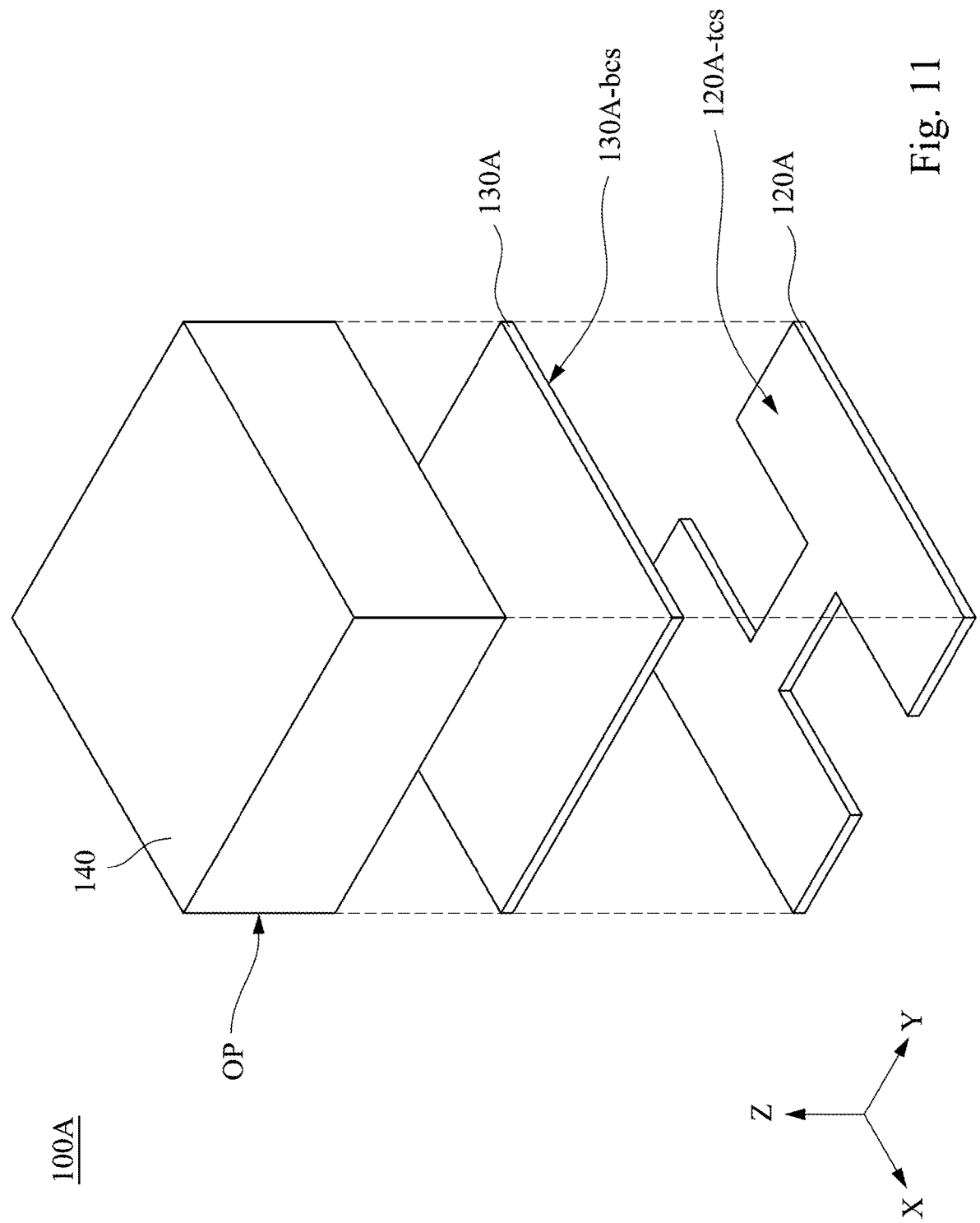

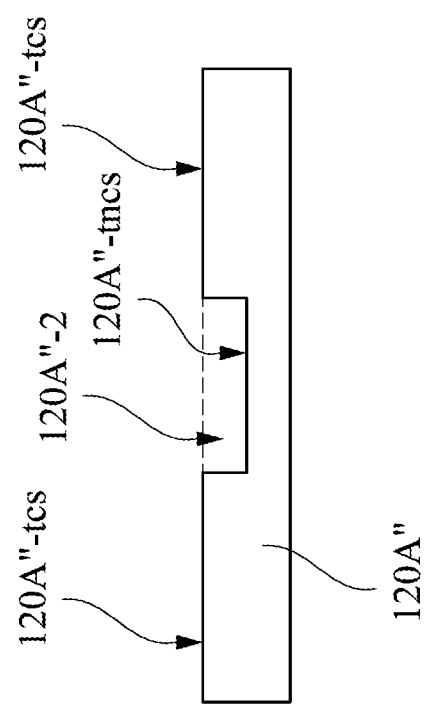
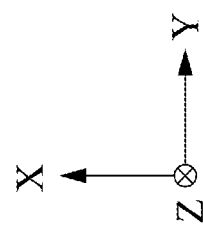
Fig. 13

ELECTRICAL BINDING STRUCTURE AND METHOD OF FORMING THE SAME

BACKGROUND

Field of Invention

The present disclosure relates to an electrical binding structure and a method of forming an electrical binding structure.

Description of Related Art

The statements in this section merely provide background information related to the present disclosure and do not necessarily constitute prior art.

Traditional technologies for transferring of devices include transfer by wafer bonding from a transfer wafer to a receiving substrate. One such implementation is "direct bonding" involving one bonding step of an array of devices from a transfer wafer to a receiving substrate, followed by removal of the transfer wafer. Another such implementation is "indirect bonding" which involves two bonding/de-bonding steps. In indirect bonding, a transfer head may pick up an array of devices from a donor substrate, and then bond the array of devices to a receiving substrate, followed by removal of the transfer head.

SUMMARY

One of the important issues that may influence the quality of transferring is the very instant that the devices are in contact with the receiving wafer. According to some embodiments of the present disclosure, an electrical binding structure is provided. The electrical binding structure includes a substrate, a contact pad set, and a combination of a micro device and an electrode. The contact pad set is on the substrate in which the contact pad set includes at least one contact pad, and the at least one contact pad is conductive. The combination of the micro device and the electrode is on the contact pad set. Opposite sides of the electrode are respectively in contact with the micro device and the contact pad set in which at least the contact pad set and the electrode define at least one volume space. A vertical projection of the at least one volume space projected on the substrate is overlapped with a vertical projection of one of the contact pad set and the electrode projected on the substrate. The vertical projection of the at least one volume space projected on the substrate is enclosed by a vertical projection of an outer periphery of the micro device projected on the substrate.

According to some embodiments of the present disclosure, a method of forming an electrical binding structure is provided. The method includes: forming a contact pad set on the substrate in which the contact pad set includes at least one contact pad, and the at least one contact pad is conductive; placing a combination of a micro device and an electrode on the contact pad set such that opposite sides of the electrode are respectively in contact with the micro device and the contact pad set in which at least the contact pad set and the electrode define at least one volume space, a vertical projection of the at least one volume space projected on the substrate is overlapped with a vertical projection of one of the contact pad set and the electrode projected on the substrate, and said vertical projection of the at least one volume space projected on the substrate is enclosed by a vertical projection of an outer periphery of the micro device projected on the substrate; forming a liquid layer between the electrode and the contact pad set such that the micro device is gripped by a capillary force produced by the liquid layer; and evaporating the liquid layer such that the electrode is bound to the contact pad set and is in electrical contact with the contact pad set.

According to some embodiments of the present disclosure, an electrical binding structure is provided. The electrical binding structure includes a substrate, a contact pad set, and a combination of a micro device and an electrode. The contact pad set is on the substrate in which the contact pad set includes at least one contact pad, and the at least one contact pad is conductive. The combination of the micro device and the electrode is on the contact pad set. Opposite sides of the electrode are respectively in contact with the micro device and the contact pad set. A bottom contact surface of the electrode is in contact with a top contact surface of the contact pad set. A vertical projection of one of the bottom contact surface and the top contact surface projected on the substrate is divided into at least one overlapped portion and at least one non-overlapped portion based on a vertical projection of another of the bottom contact surface and the top contact surface projected on the substrate. The at least one overlapped portion and the at least one non-overlapped portion are enclosed by a vertical projection of an outer periphery of the micro device projected on the substrate.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 1E is a bottom view of the contact pad set in FIG. 1C and the electrode in FIG. 1D when the electrode is in proximity to or in contact with the contact pad set according to some embodiments of the present disclosure;

FIG. 3A is a cross-sectional view of one type of the contact pad set according to some embodiments of the present disclosure;

FIG. 3B is a cross-sectional view of one type of the contact pad set according to some embodiments of the present disclosure;

FIG. 3C is a cross-sectional view of one type of the contact pad set according to some embodiments of the present disclosure;

FIG. 3D is a cross-sectional view of one type of the contact pad set according to some embodiments of the present disclosure;

FIG. 4B is a bottom view of a top contact surface a contact pad set according to some embodiments of the present disclosure;

FIG. 4C is a bottom view of a bottom contact surface an electrode according to some embodiments of the present disclosure;

FIG. 4E is a bottom view of a top contact surface of a contact pad set 120B' according to some embodiments of the present disclosure;

FIG. 4F is a bottom view of a bottom contact surface an electrode according to some embodiments of the present disclosure;

FIG. 6A is a bottom view of a top contact surface of a contact pad set according to some embodiments of the present disclosure;

FIG. 6B is a bottom view of a bottom contact surface an electrode according to some embodiments of the present disclosure;

FIG. 9 is a flow chart of a method of forming an electrical binding structure according to some embodiments of the present disclosure;

FIG. 10A is a schematic cross-sectional view of an intermediate stage of the method of forming the electrical binding structure according to some embodiments of the present disclosure;

FIG. 11 is a schematic exploded view illustrating an electrical binding structure according to some embodiments of the present disclosure;

FIG. 13 is cross-sectional views of a contact pad set the same as that illustrated by FIG. 3B with additional labels according to some embodiments of the present disclosure.

DETAILED DESCRIPTION

Figure 1A:
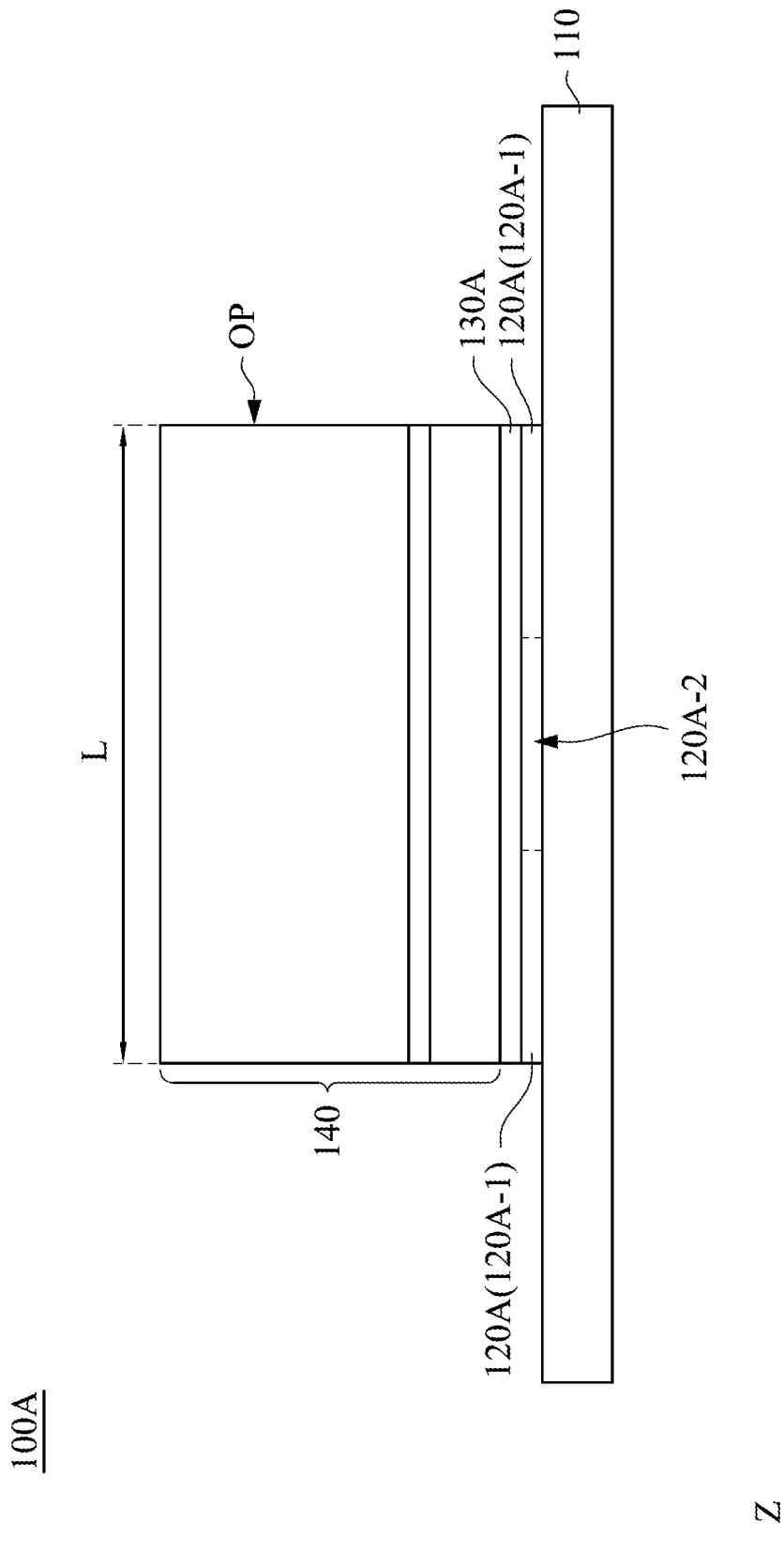
FIG. 1A is a schematic cross-sectional view of an electrical binding structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Reference is made to FIGS. 1A to 1H. FIG. 1A is a schematic cross-sectional view of an electrical binding structure 100A according to some embodiments of the present disclosure. The electrical binding structure 100A includes a substrate 110, a contact pad set 120A, and a combination of a micro device 140 and an electrode 130A. The contact pad set 120A is on the substrate 110 in which the contact pad set 120A includes at least one contact pad 120A-1, and the contact pad 120A-1 is conductive. In some embodiments, a thickness of the contact pad set 120A is smaller than or equal to about 2 μm, and preferably smaller than or equal to about 0.5 μm. The combination of the micro device 140 and the electrode 130A is on the contact pad set 120A. In some embodiments, a thickness of the electrode 130A ranges from about 0.2 μm to about 2 μm, and preferably ranges from about 0.3 μm to about 1 μm. Opposite sides of the electrode 130A are respectively in contact with the micro device 140 and the contact pad set 120A in which at least the contact pad set 120A and the electrode 130A define at least one volume space 120A-2. In some embodiments, a number of the at least one volume space 120A-2 is plural. A vertical projection of the at least one volume space 120A-2 projected on the substrate 110 is overlapped with a vertical projection of one of the contact pad set 120A and the electrode 130A projected on the substrate 110. Specifically, the vertical projection of the at least one volume space 120A-2 projected on the substrate 110 is overlapped with a vertical projection of only one of the contact pad set 120A and the electrode 130A projected on the substrate 110. In the embodiments illustrated by FIG. 1A, the vertical projection of the volume space 120A-2 projected on the substrate 110 is overlapped with a vertical projection of the electrode 130A projected on the substrate 110, but not overlapped with a vertical projection of the contact pad set 120A projected on the substrate 110. The vertical projection of the volume space 120A-2 projected on the substrate 110 is enclosed by a vertical projection of an outer periphery OP of the micro device 140 projected on the substrate 110.

Figure 1B:
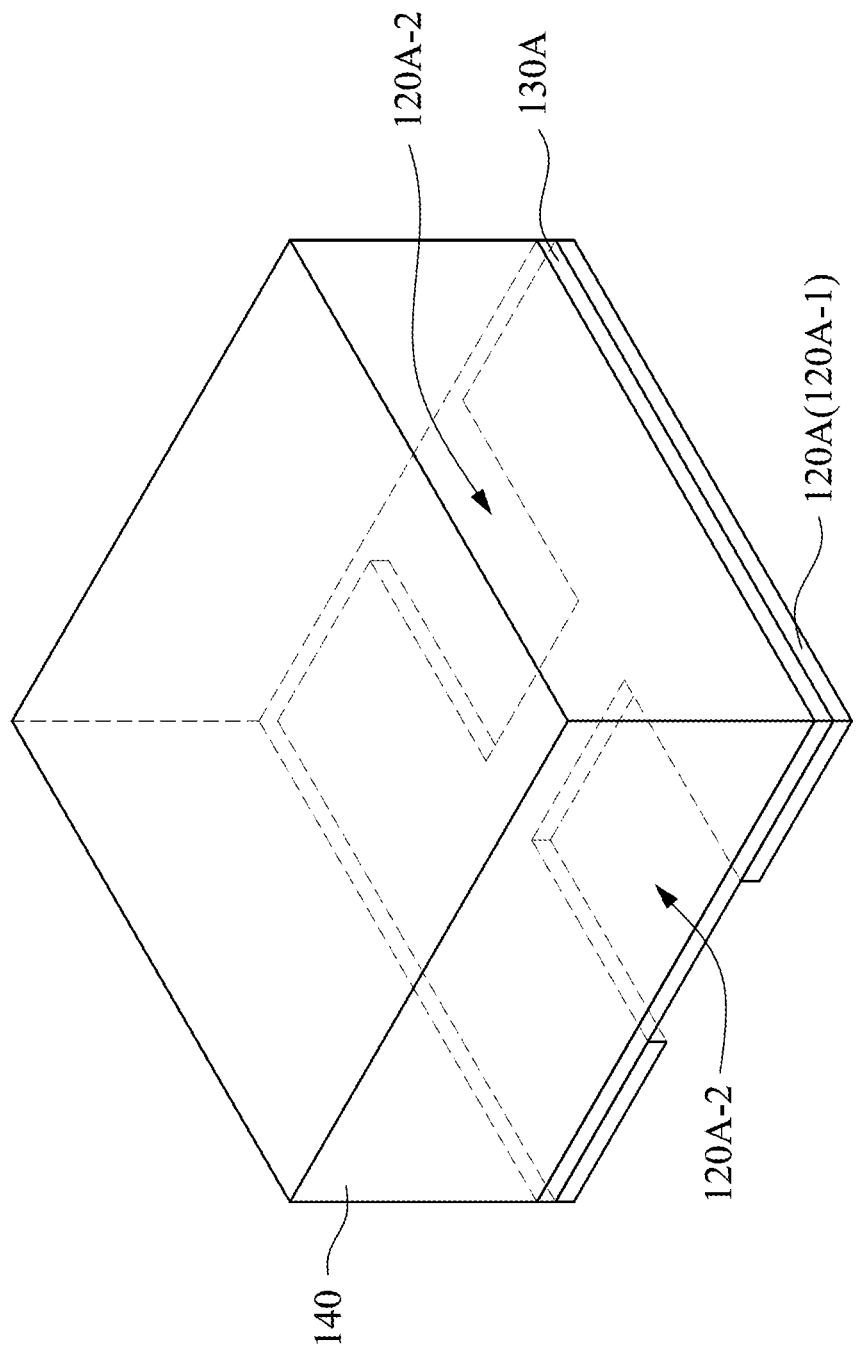
FIG. 1B is a perspective view of the electrical binding structure according to some embodiments of the present disclosure.
Figure 1D:
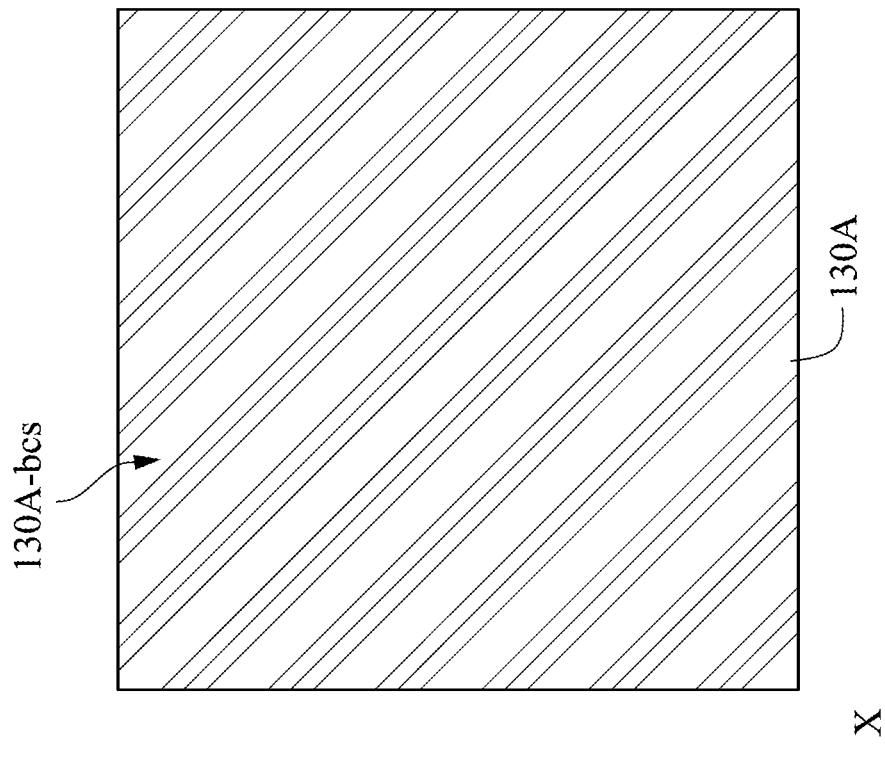
FIG. 1D is a bottom view of a bottom contact surface of an electrode according to some embodiments of the present disclosure.
Figure 1C:
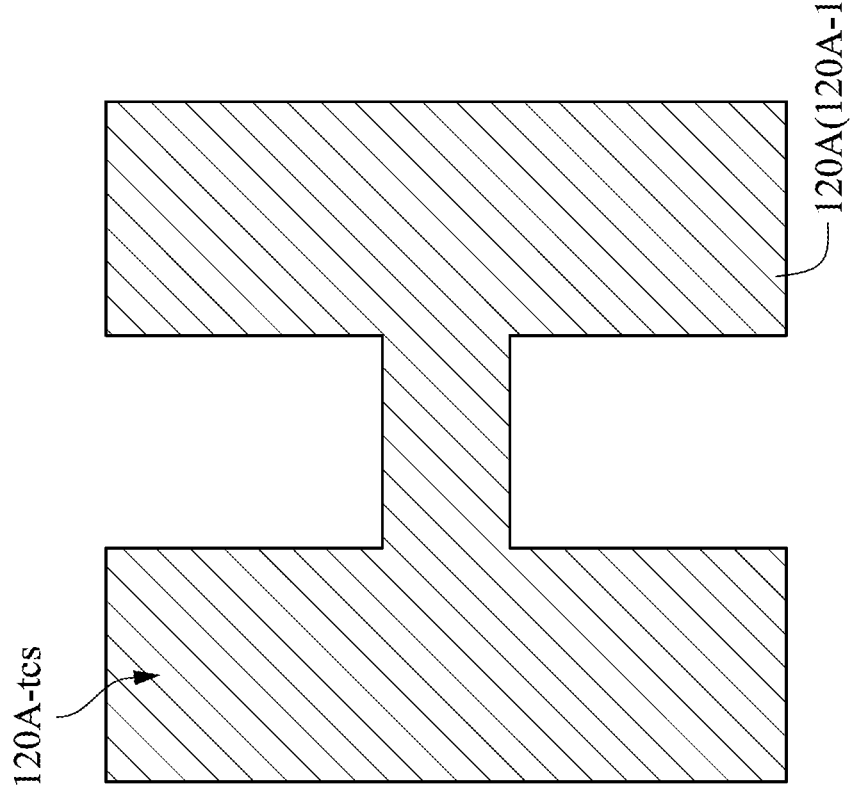
FIG. 1C is a bottom view of a top contact surface of a contact pad set according to some embodiments of the present disclosure.
Figure 1G:
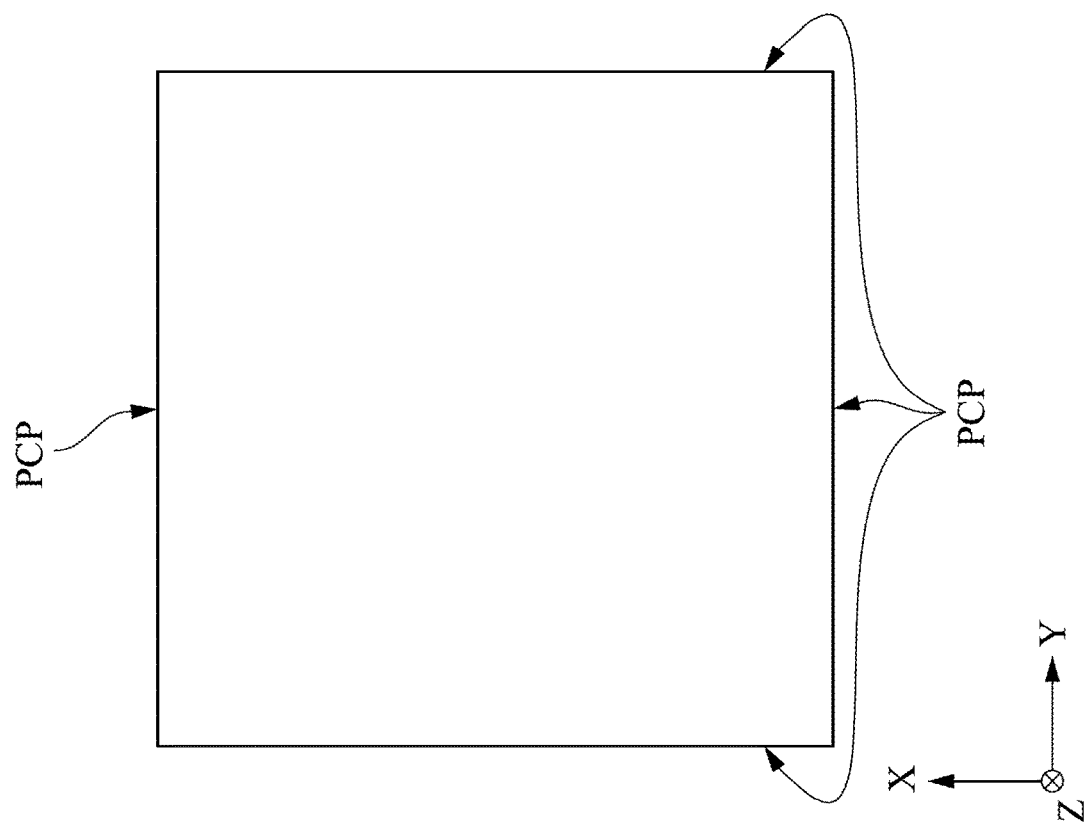
FIG. 1G is a schematic view of a primitive contact periphery according to some embodiments of the present disclosure.
Figure 1F:
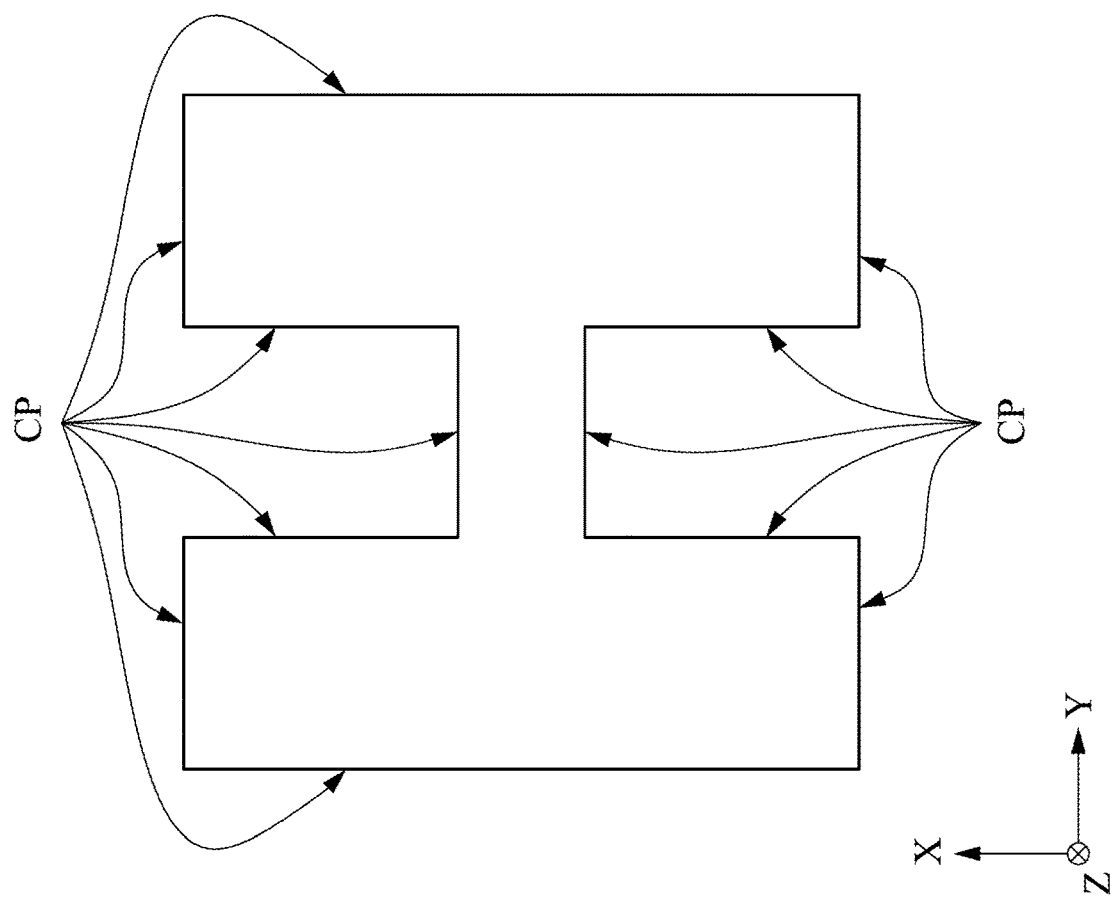
FIG. 1F is a schematic view of a contact periphery according to some embodiments of the present disclosure.
Figure 1H:
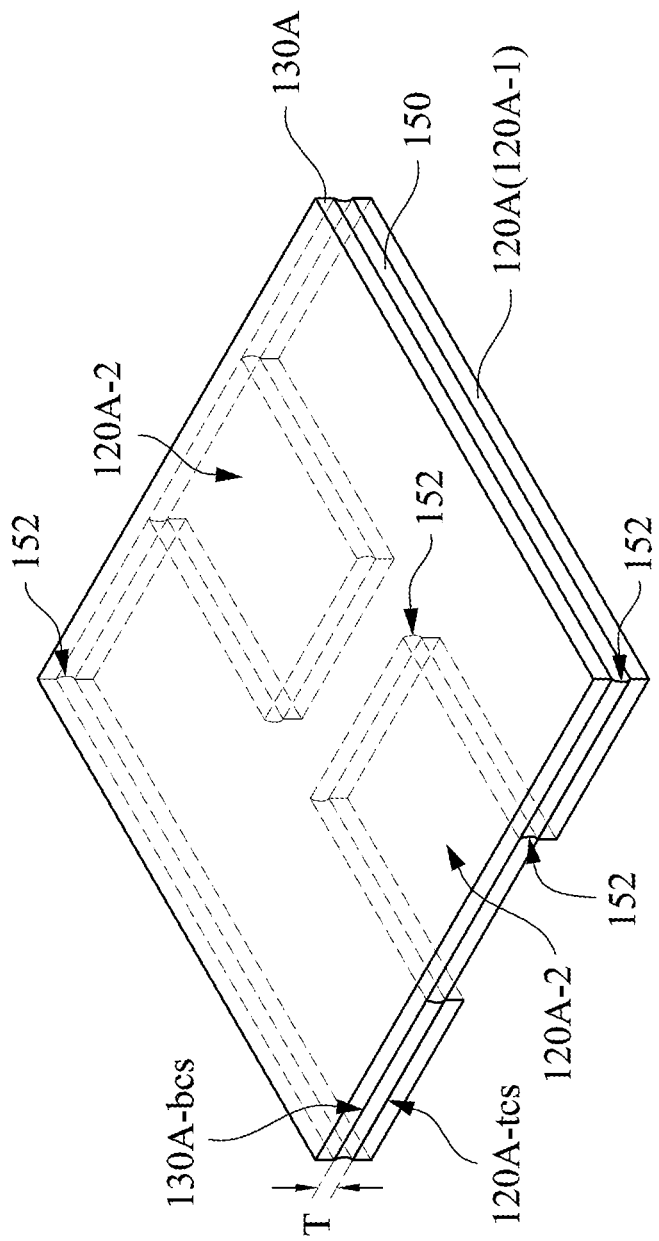
FIG. 1H is a schematic perspective view illustrating a liquid layer respectively in contact with the electrode and the contact pad set according to some embodiments of the present disclosure.

FIG. 1B is a perspective view of the electrical binding structure 100A according to some embodiments of the present disclosure. FIG. 1C is a bottom view of the contact pad set 120A according to some embodiments of the present disclosure. FIG. 1D is a bottom view of the electrode 130A according to some embodiments of the present disclosure. FIG. 1E is a bottom view of the contact pad set 120A in FIG. 1C and the electrode 130A in FIG. 1D when the electrode 130A is in proximity to or in contact with the contact pad set 120A according to some embodiments of the present disclosure. FIG. 1F is a schematic view of a contact periphery CP according to some embodiments of the present disclosure. FIG. 1G is a schematic view of a primitive contact periphery PCP according to some embodiments of the present disclosure. FIG. 1H is a schematic perspective view illustrating a liquid layer 150 respectively in contact with the electrode 130A and the contact pad set 120A according to some embodiments of the present disclosure.

FIGS. 1B to 1D illustrate one of possible configurations illustrated by FIG. 1A. FIG. 1B provides a three-dimensional view that makes the structural features of the electrical binding structure 100A easier to be understood. In some embodiments, due to different shapes between (a top contact surface 120A-tcs of) the contact pad set 120A (e.g., a shape of "H" as exemplified in FIG. 1C) and (a bottom contact surface 130A-bcs of) the electrode 130A (e.g., a shape of square or rectangle as exemplified in FIG. 1D), when the contact pad set 120A and the electrode 130A are brought into proximity to the liquid layer 150 (e.g., a water layer) therebetween and opposite sides of the liquid layer 150 are respectively in contact with the contact pad set 120A and the electrode 130A, a total length of the contact periphery CP (as referred to FIG. 1F), which is a periphery formed after the top contact surface 120A-tcs is in contact with the bottom contact surface 130A-bcs, is greater than a total length of a primitive contact periphery PCP in which the shape of the contact pad set 120A is not "purposely designed" (as referred to FIG. 1G). FIG. 1H may also be helpful in understanding the embodiments as mentioned. Those "purposely designed" shapes are designed to increase a total length of a contact periphery CP between the contact pad set 120A and the electrode 130A. Taking embodiments illustrated by FIGS. 1C and 1D as an example, when the shape of the contact pad set 120A is "H" and the shape of the electrode 130A is square (or rectangle), the contact periphery CP is greater than the primitive contact periphery PCP in which both the shape of the contact pad set 120A and the shape of the electrode 130A are square or rectangle. It is noted that if two sunken portion of said "H" are re-filled, an area of that filled H (i.e., also a square or a rectangle) will be the same as an area which is enclosed by the primitive contact periphery PCP. A perspective (three-dimensional) view that illustrates the embodiments mentioned above is shown in FIGS. 1B and 1H. In the embodiments illustrated by FIGS. 1C to 1E, the volume spaces 120A-2 are defined by the electrode 130A from the top, the contact pad set 120A from the side, the substrate 110 from the bottom, and a vertical projection of the outer periphery OP of the micro device 140 relative to X-Y plane from the side.

In some embodiments, the electrode 130A may be brought into proximity to the contact pad set 120A and in contact with the liquid layer 150 therebetween, such that the electrode 130A and the micro device 140 thereon are gripped by a capillary force produced by the liquid layer 150 (e.g., referred to FIG. 1H in which meniscuses 152 of the liquid layer 150 are formed due to the capillary force). After that, the liquid layer 150 is evaporated such that the electrode 130A is stuck and bound to the contact pad set 120A. In these embodiments, since the contact pad set 120A is designed in the shape of "H", said capillary force is greater than the case when both of the electrode 130A and the contact pad set 120A are designed in the shape of square. The greater capillary force is of great help in a quality of binding and the subsequent bonding between the electrode 130A and the contact pad set 120A since the capillary force can assist in fixing the electrode 130A within a controllable region when the electrode 130A is attached to the liquid layer 150. Furthermore, the capillary force can assist a formation of binding (and also a formation of bonding) between the electrode 130A and the contact pad set 120A during and after the evaporation of the liquid layer 150. Said binding is a special phenomenon found in these kinds of liquid layer 150 assisted gripping and contact. The bonding is a phenomenon when two objects (usually metals) are in contact and atoms are diffused between the two objects. In some embodiments, a lateral length L of the micro device is less than or equal to about 100 μm. The restriction of the lateral length L is to ensure that the capillary force significantly helps and dominates the binding between the electrode 130A and the contact pad set 120A.

It is noted that the contact periphery CP and the primitive contact periphery PCP as mentioned can be interpreted as a contact periphery (or a plurality of discrete contact peripheries, as will be mentioned in some embodiments later) when the bottom contact surface 130A-bcs of the electrode 130A is in contact with the top contact surface 120A-tcs of the contact pad set 120A. They can also be interpreted as a contact periphery (or contact peripheries) when opposite sides of the liquid layer 150 are between and respectively in contact with the electrode 130A and the contact pad set 120A. In this case, the contact periphery CP (and the primitive contact periphery PCP) is regarded as a periphery having a thickness T (as shown in FIG. 1H) measured from the bottom contact surface 130A-bcs of the electrode 130A to the top contact surface 120A-tcs of the contact pad set 120A through a periphery of the liquid layer 150.

Figure 2A:
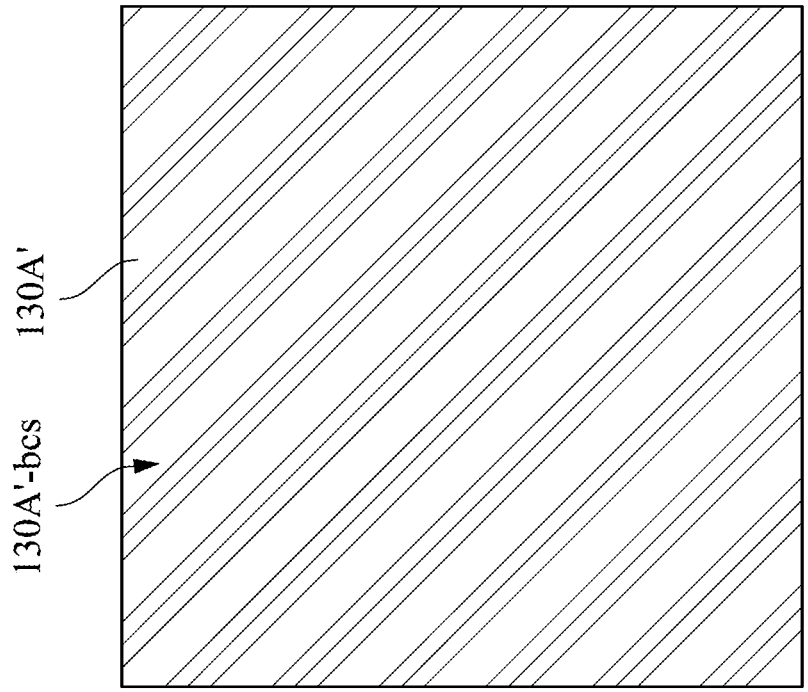
FIG. 2A is a bottom view of a top contact surface of a contact pad set according to some embodiments of the present disclosure.
Figure 2B:
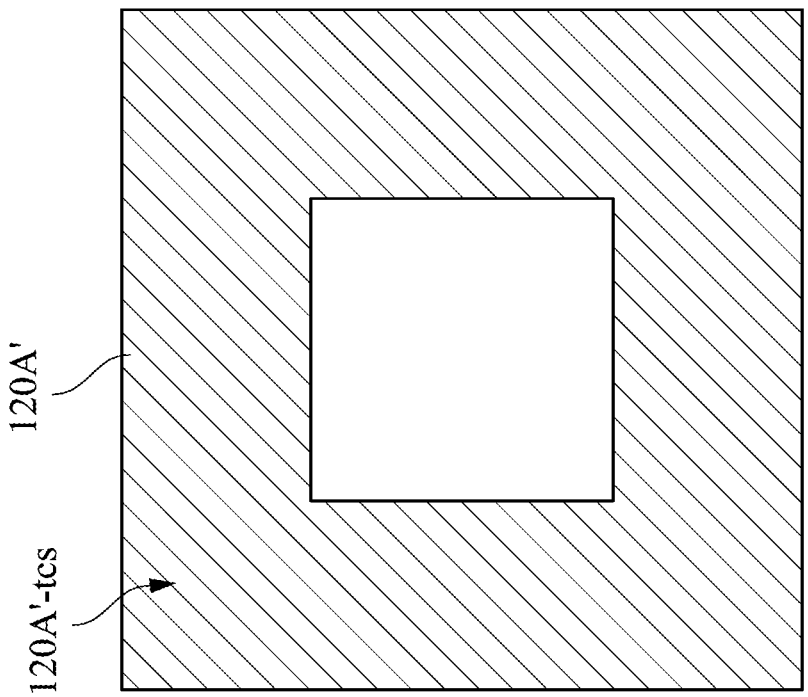
FIG. 2B is a bottom view of a bottom contact surface of an electrode according to some embodiments of the present disclosure.
Figure 2C:
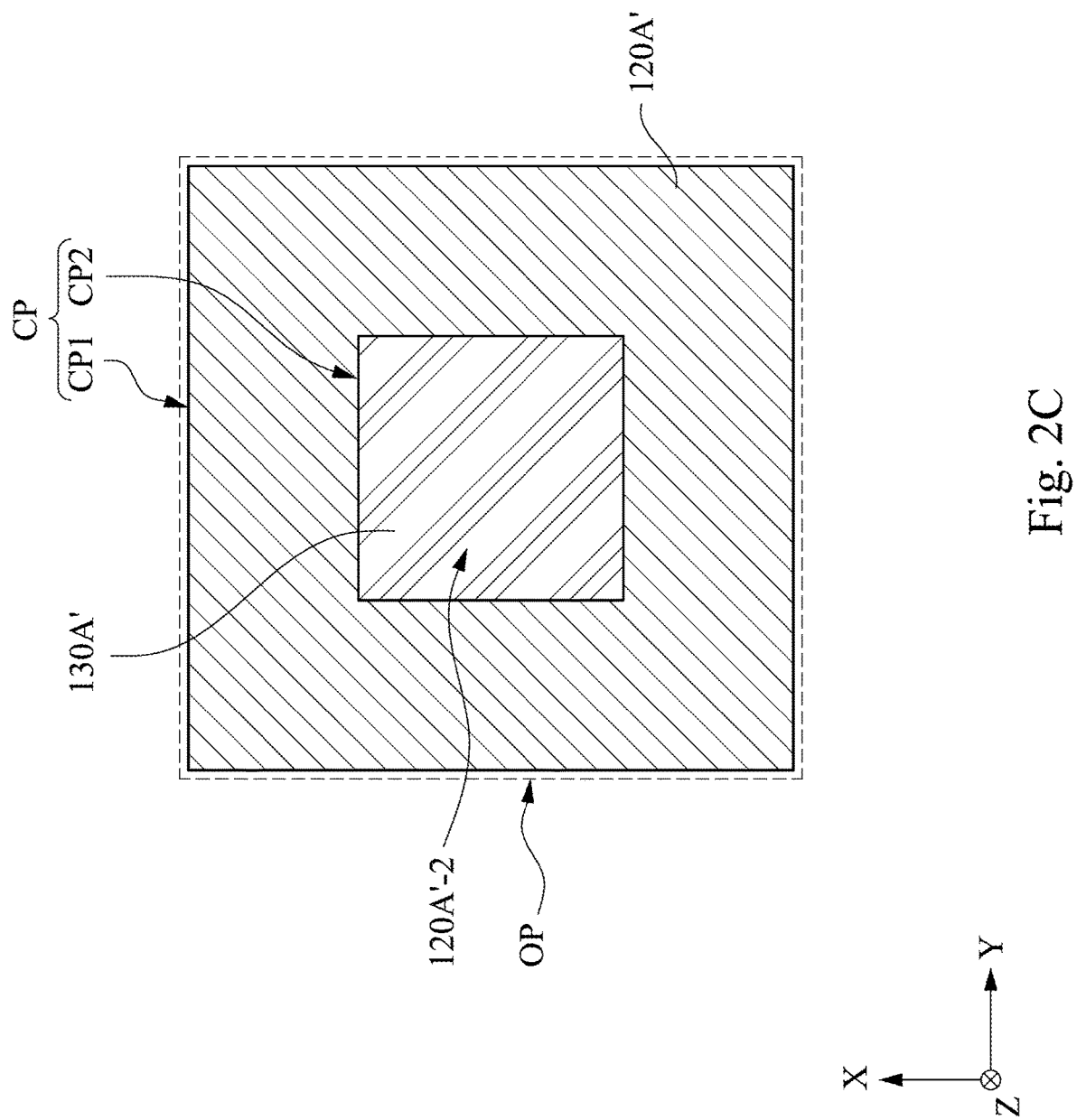
FIG. 2C is a bottom view of the contact pad set in FIG. 2A and the electrode in FIG. 2B when the electrode is in proximity to or in contact with the contact pad set according to some embodiments of the present disclosure.

Reference is made to FIGS. 2A to 2C. FIG. 2A is a bottom view of a top contact surface 120A'-tcs of a contact pad set 120A' according to some embodiments of the present disclosure. FIG. 2B is a bottom view of a bottom contact surface 130A'-bcs of an electrode 130A' according to some embodiments of the present disclosure. FIG. 2C is a bottom view of the contact pad set 120A' in FIG. 2A and the electrode 130A' in FIG. 2B when the electrode 130A' is in proximity to or in contact with the contact pad set 120A' according to some embodiments of the present disclosure. Note that FIG. 1A can also be interpreted by FIGS. 2A to 2C because FIG. 1A is a cross-sectional view. A difference between embodiments as illustrated by FIGS. 2A to 2C and the embodiments as illustrated by FIGS. 1C to 1E is that a geometrical relationship between the volume space 120A'-2 and the contact pad set 120A' and a geometrical relationship between the volume spaces 120A-2 and the contact pad set 120A are different. Specifically, the volume space 120A'-2 as shown in FIGS. 2A to 2C is completely enclosed by the contact pad 120A' on X-Y plane, while the volumes spaces 120A-2 as shown in FIGS. 1C to 1E are exposed at the side, and are surrounded by the contact pad 120A by three of four sides on X-Y plane. However, technical effects of the embodiments as shown in FIGS. 2A to 2C are similar to the technical effects of the embodiments as shown in FIGS. 1C to 1E, and will not be described in details again. It is noted that the contact periphery CP including two different contact peripheries CP1, CP2 which are discrete from each other. The contact periphery CP is a sum of contact peripheries CP1 and CP2. In the following content of the different embodiments, the contact periphery will be labeled only by "CP" for simplicity even though there are different shapes of contact peripheries CP. In the embodiments illustrated by FIGS. 2A to 2C, the volume spaces 120A'-2 are defined by the electrode 130A' from the top, the contact pad set 120A' from the side, and the substrate 110 from the bottom.

Reference is made to FIGS. 3A to 3D. FIGS. 3A to 3D respectively are cross-sectional views of four different types of contact pad sets according to some embodiments of the present disclosure. The contact pad 120A (120A') illustrated by FIG. 3A can be regarded as the same as that illustrated by FIGS. 1A to 2C. In the contact pad sets 120A" and 120A'" illustrated by FIGS. 3B, 3C, and 3D, there are portions of the contact pad sets 120A" and 120A'" underneath the volume space 120A"-2 and 120A'"-2 such that the volume space 120A"-2 and 120A'"-2 are defined merely by the electrode 130A (130A'), the contact pad set 120A" (120A'"), and optionally the outer periphery OP of the micro device 140 by said "vertical projection" limitation as mentioned above. In the embodiments illustrated by FIGS. 3B, 3C, and 3D, the volume spaces 120A"-2 and 120A'"-2 are respectively defined by the electrode 130A (130A') from the top, the contact pad set 120A", 120A'" from the side and from the bottom, and optionally the vertical projection of the outer periphery OP of the micro device 140 relative to X-Y plane from the side.

Figure 4A:
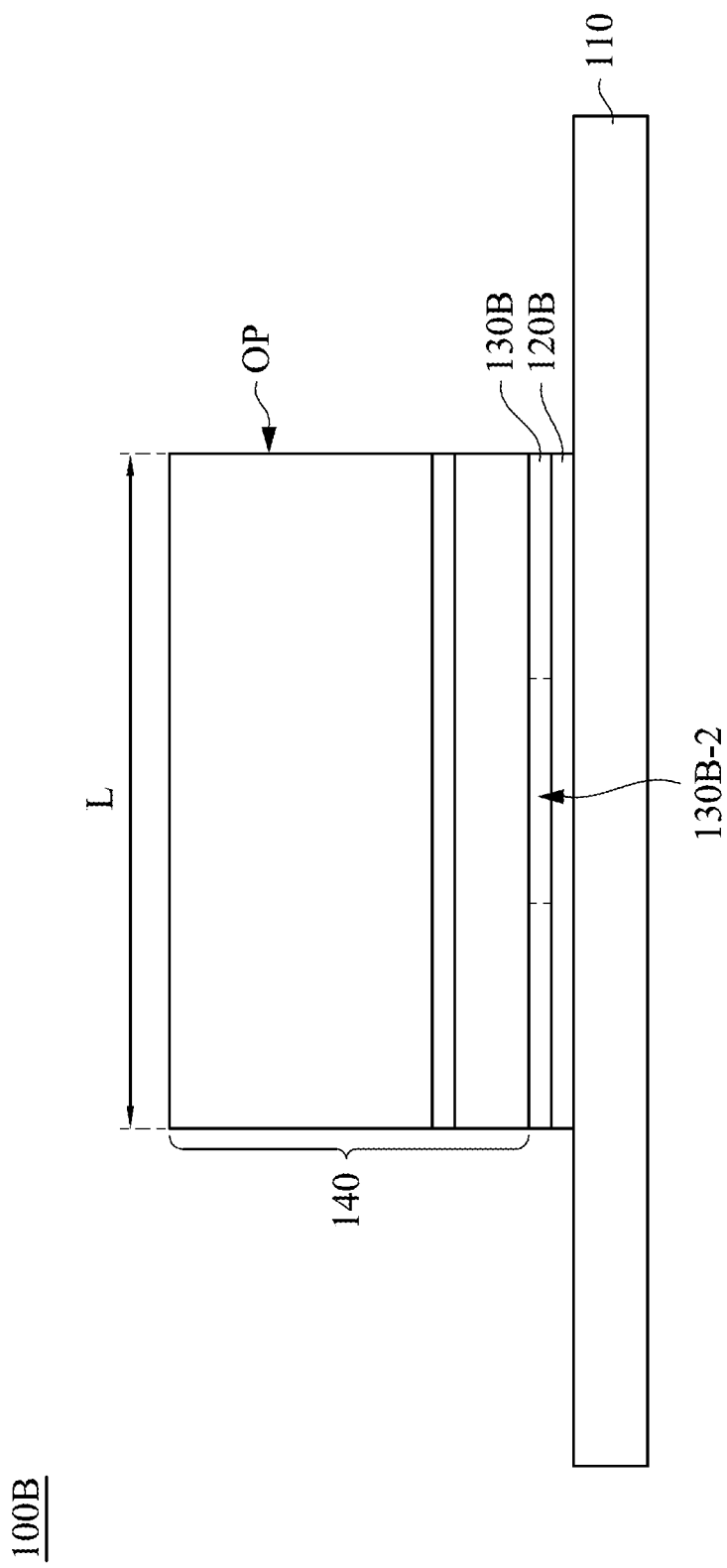
FIG. 4A is a schematic cross-sectional view of an electrical binding structure 100B according to some embodiments of the present disclosure.
Figure 4D:
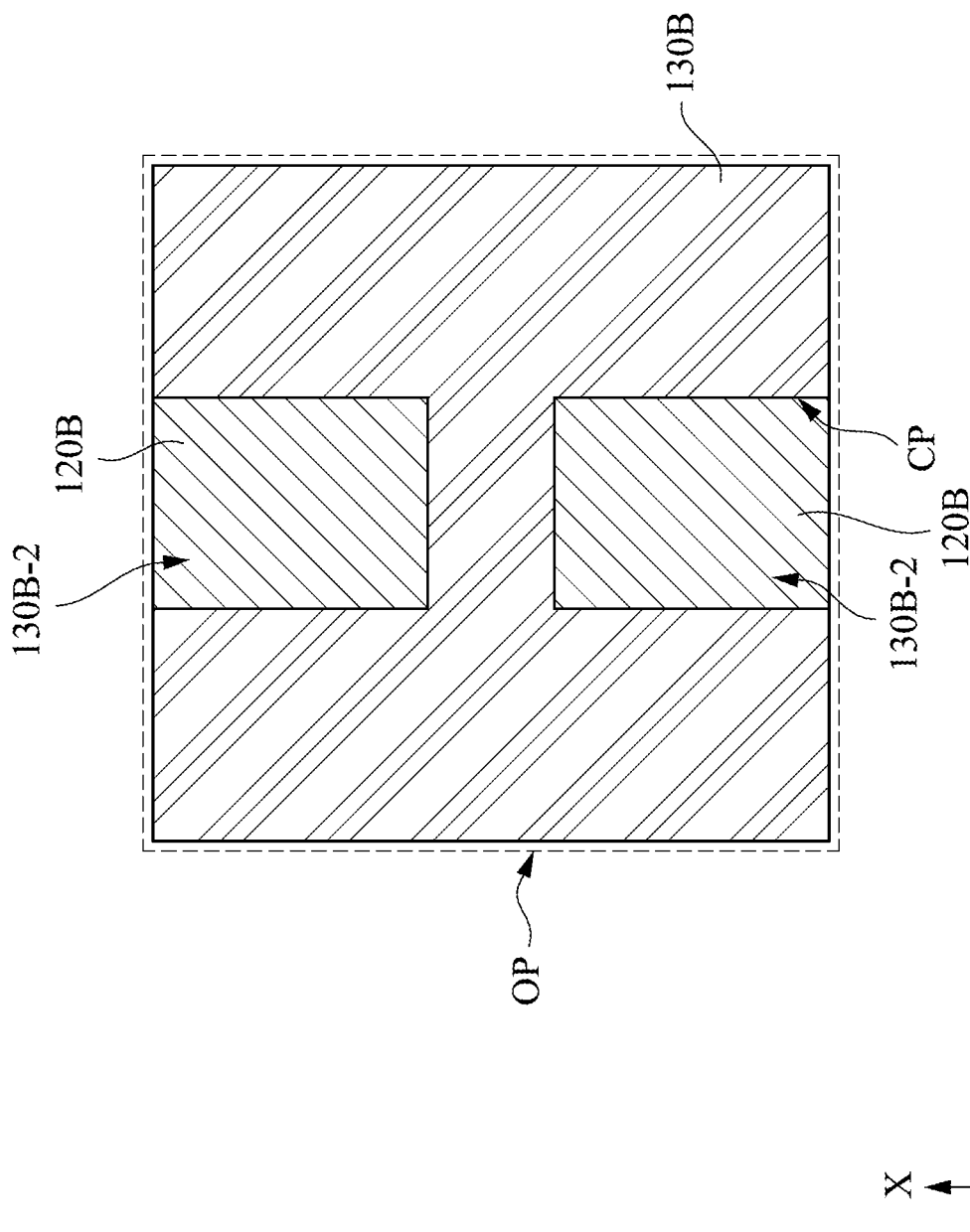
FIG. 4D is a top view of the contact pad set in FIG. 4B and the electrode in FIG. 4C when the electrode is in proximity to or in contact with the contact pad set according to some embodiments of the present disclosure.

Reference is made to FIGS. 4A to 4G. A difference between embodiments illustrated by FIGS. 4A to 4G and the embodiments illustrated by FIGS. 1A to 3C is that a structural feature of the contact pad set (120A series) and a structure feature of the electrode (130A series) are exchanged. Specifically, purposely designed shapes are now performed on the electrode. FIG. 4A is a schematic cross-sectional view of an electrical binding structure 100B according to some embodiments of the present disclosure. FIG. 4B is a bottom view of a top contact surface 120B-tcs of a contact pad set 120B according to some embodiments of the present disclosure. FIG. 4C is a bottom view of a bottom contact surface 130B-bcs of the electrode 130B according to some embodiments of the present disclosure. FIG. 4D is a top view of the contact pad set 120B in FIG. 4B and the electrode 130B in FIG. 4C when the electrode 130B is in proximity to or in contact with the contact pad set 120B according to some embodiments of the present disclosure. Volume spaces 130B-2 are defined by the electrode 130B from the side, the contact pad set 120B from the bottom, the micro device 140 from the top, and optionally the vertical projection of the outer periphery OP of the micro device 140 relative to X-Y plane from the side.

Figure 4G:
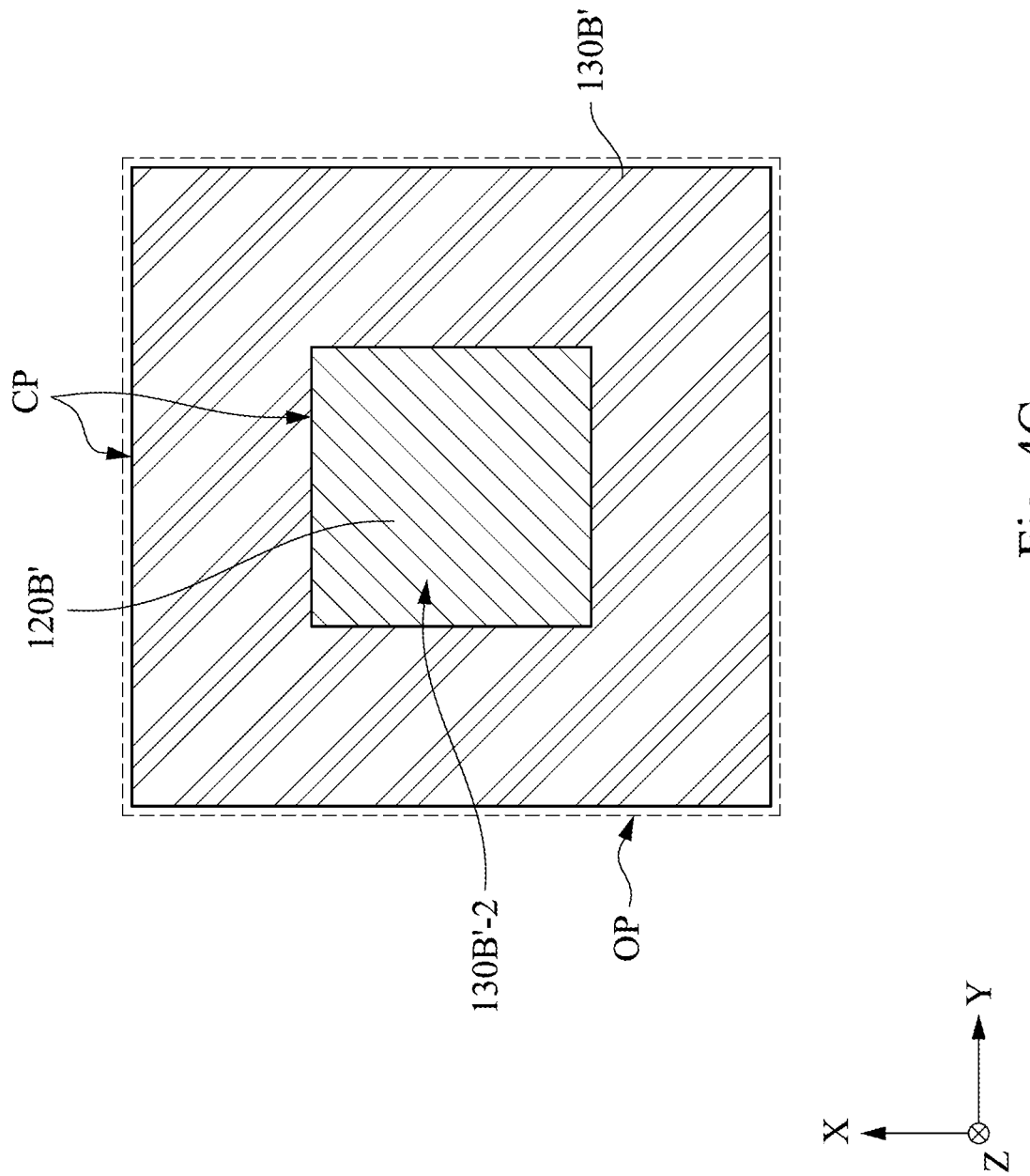
FIG. 4G is a top view of the contact pad set in FIG. 4E and the electrode in FIG. 4F when the electrode is in proximity to or in contact with the contact pad set according to some embodiments of the present disclosure.

Reference is made to FIGS. 4E to 4G. FIG. 4E is a bottom view of a top contact surface 120B'-tcs of a contact pad set 120B' according to some embodiments of the present disclosure. FIG. 4F is a bottom view of a bottom contact surface 130B'-bcs of an electrode 130B' according to some embodiments of the present disclosure. FIG. 4G is a top view of the contact pad set 120B' in FIG. 4E and the electrode 130B' in FIG. 4F when the electrode 130B' is in proximity to or in contact with the contact pad set 120B' according to some embodiments of the present disclosure. The volume spaces 130B'-2 is defined by the electrode 130B' from the side, the micro device 140 from the top, and the contact pad set 120B' from the bottom.

Figure 5:
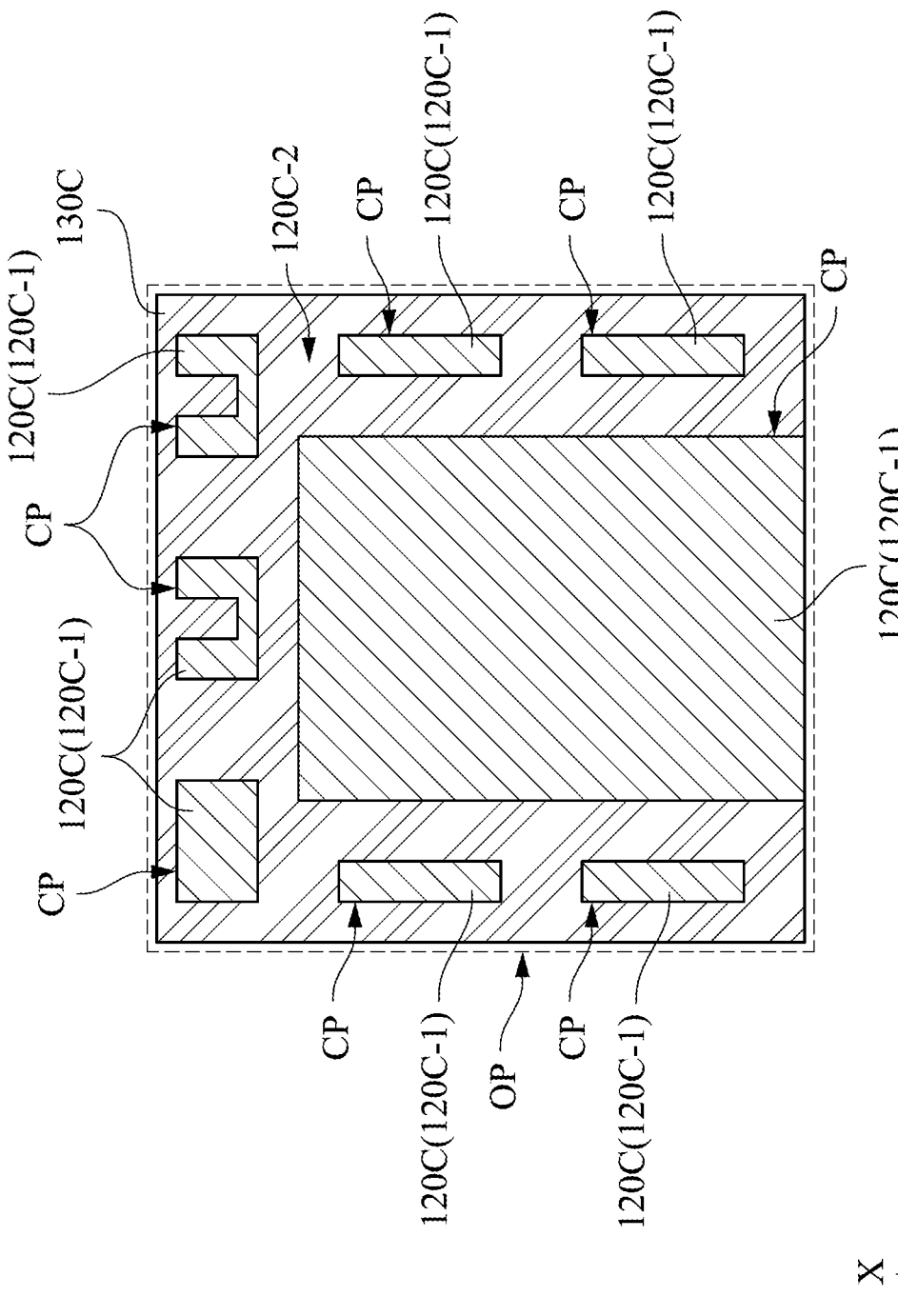
FIG. 5 is a bottom view of a contact pad set and an electrode when the electrode is in proximity to or in contact with the contact pad set according to some embodiments of the present disclosure.

Reference is made to FIG. 5. FIG. 5 is a bottom view of a contact pad set 120C and an electrode 130C when the electrode 130C is in proximity to or in contact with the contact pad set 120C according to some embodiments of the present disclosure. In these embodiments, the contact pad set 120C includes a plurality of contact pads 120C-1. At least one of the contact pads 120C-1 is electrically connected to an applied voltage source (not shown). Other contact pad(s) 120C-1 can be electrically floated (before the electrode 130C is in contact with the contact pads 120C-1) because it is (they are) used to increase the capillary force between the electrode 130C and the contact pad set 120C. It is noted that the volume space 120C-2 herein is not extended outside the outer periphery OP of the micro device 140. Specifically, the validity of the volume space 120C-2 should always obey the "vertical projection" limitation as mentioned above. That is, the vertical projection of the volume space 120C-2 projected on the substrate 110 is enclosed by a vertical projection of an outer periphery OP of the micro device 140 projected on the substrate 110. Although there may be "spaces" extended continuously outside the periphery OP of the micro device 140, those "spaces" do not contribute to the increase of said capillary force produced by the liquid layer 150 as mentioned above. It is also noted that structural features of the contact pad set 120C and the electrode 130C can be exchanged like the embodiments as mentioned before.

Figure 6C:
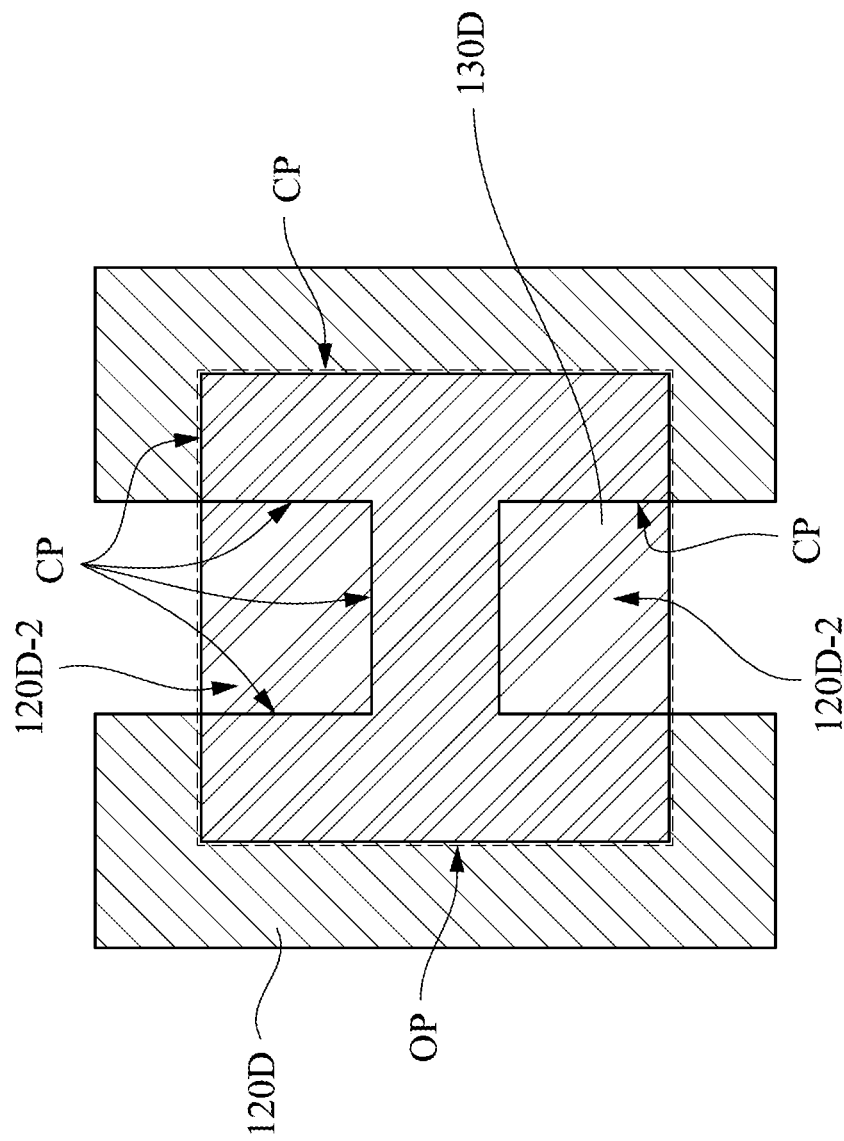
FIG. 6C is a bottom view of the contact pad set in FIG. 6A and the electrode in FIG. 6B when the electrode is in proximity to or in contact with the contact pad set according to some embodiments of the present disclosure.

Reference is made to FIGS. 6A to 6C. FIG. 6A is a bottom view of a top contact surface 120D-tcs of a contact pad set 120D according to some embodiments of the present disclosure. FIG. 6B is a bottom view of a bottom contact surface 130D-bcs of an electrode 130D according to some embodiments of the present disclosure. FIG. 6C is a bottom view of the contact pad set 120D in FIG. 6A and the electrode 130D in FIG. 6B when the electrode 130D is in proximity to or in contact with the contact pad set 120D according to some embodiments of the present disclosure. In these embodiments, a size (or a lateral length) of the micro device 140 is smaller than the contact pad set 120D. Therefore, a boundary of the volume space 120D-2 is significantly restricted by the outer periphery OP of the micro device 140 which also obeys said "vertical projection" limitation as mentioned above.

Figure 7A:
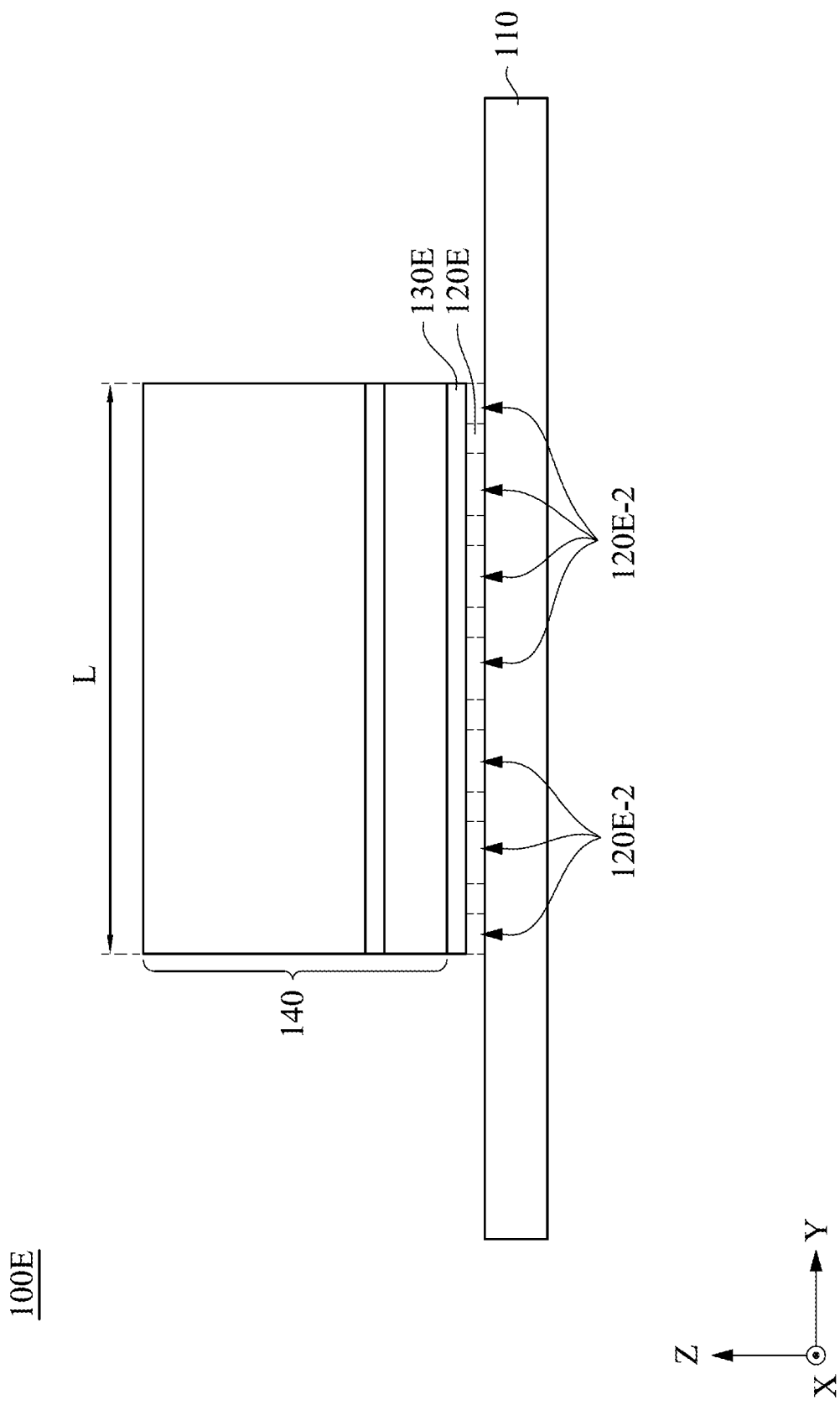
FIG. 7A is a schematic cross-sectional view of an electrical binding structure according to some embodiments of the present disclosure.
Figure 7B:
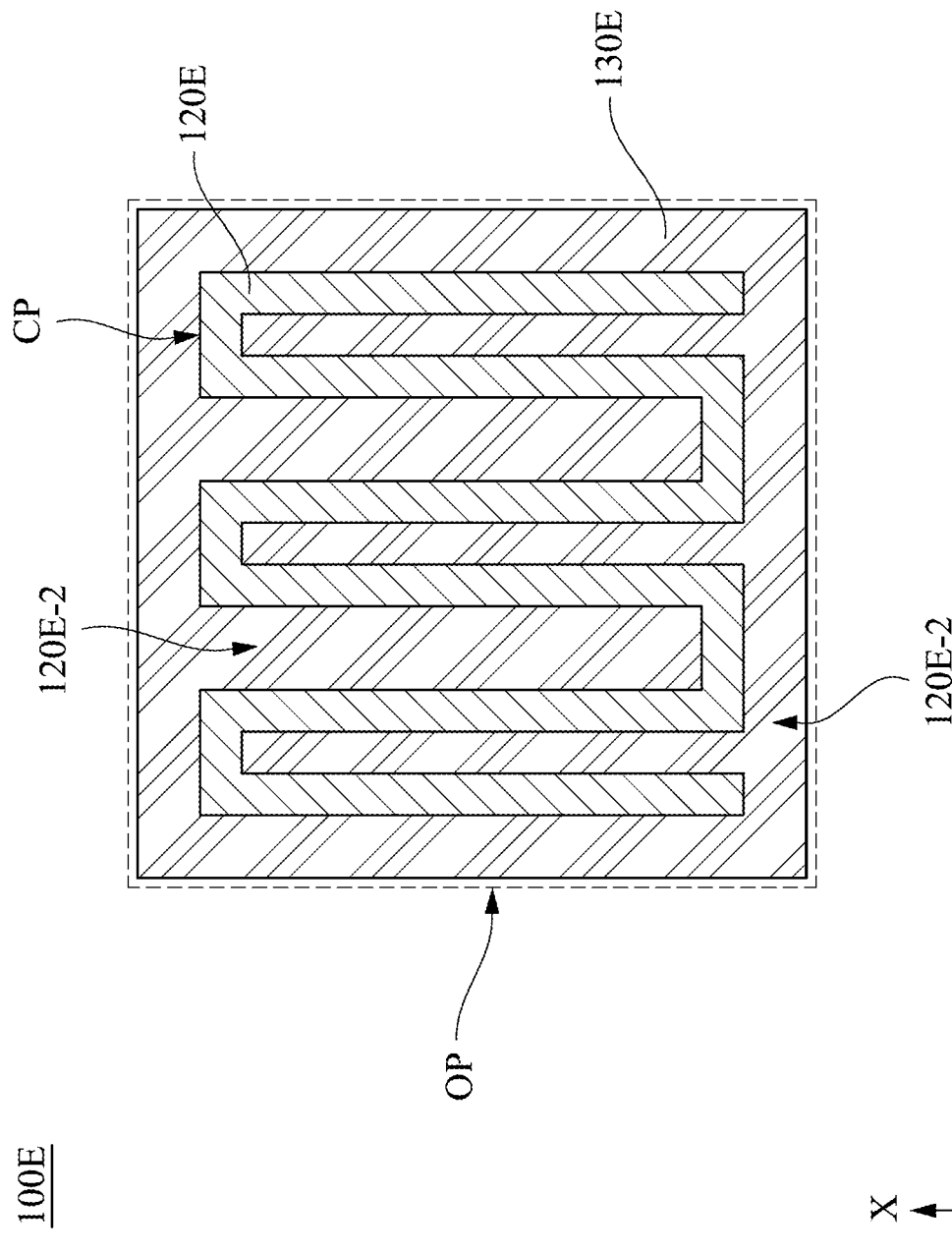
FIG. 7B is a bottom view of a contact pad set and an electrode when the electrode is in proximity to or in contact with the contact pad set according to some embodiments of the present disclosure.
Figure 8:
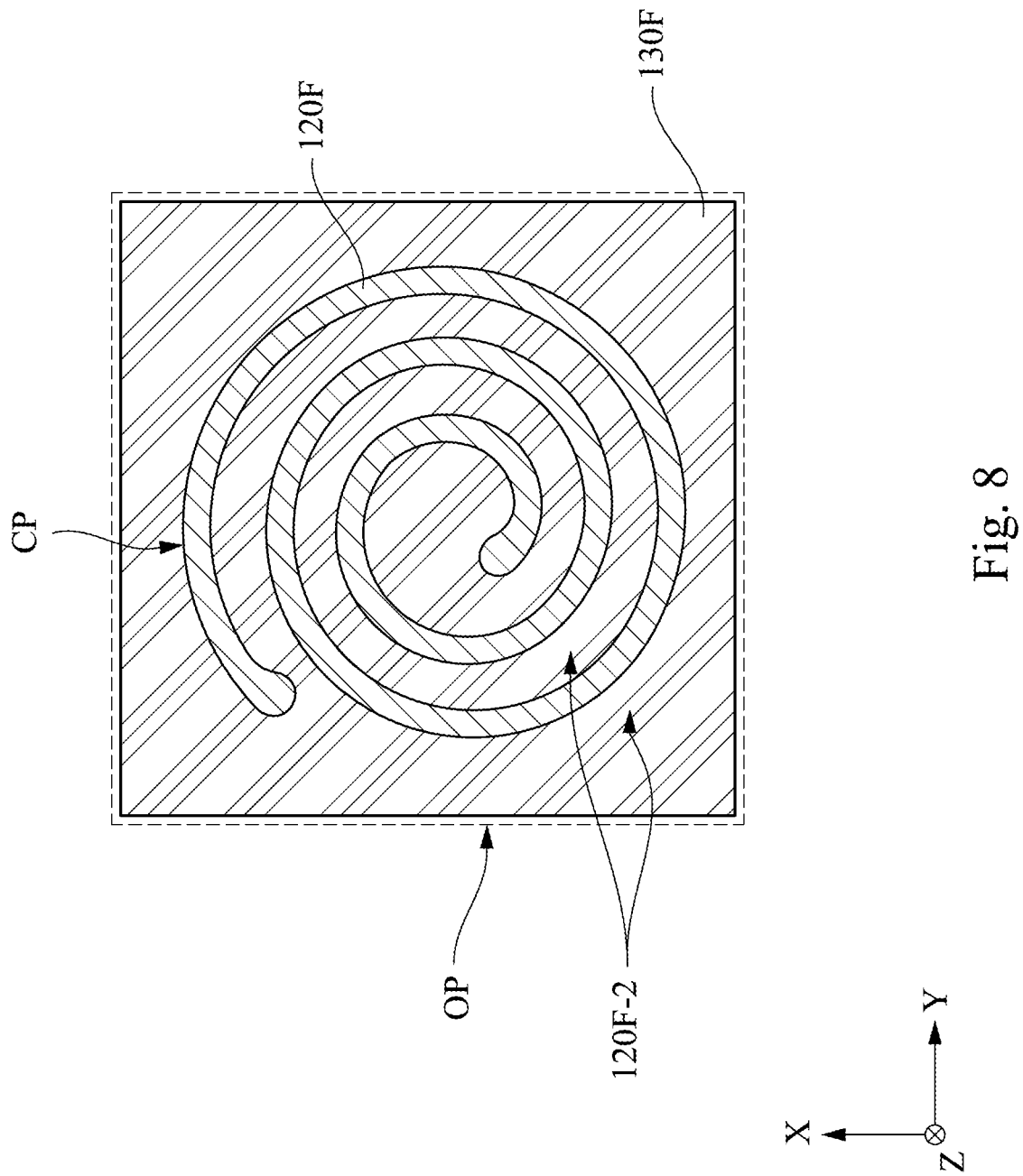
FIG. 8 is a bottom view of a contact pad set and an electrode when the electrode is in proximity to or in contact with the contact pad set according to some embodiments of the present disclosure.
Figure 10B:
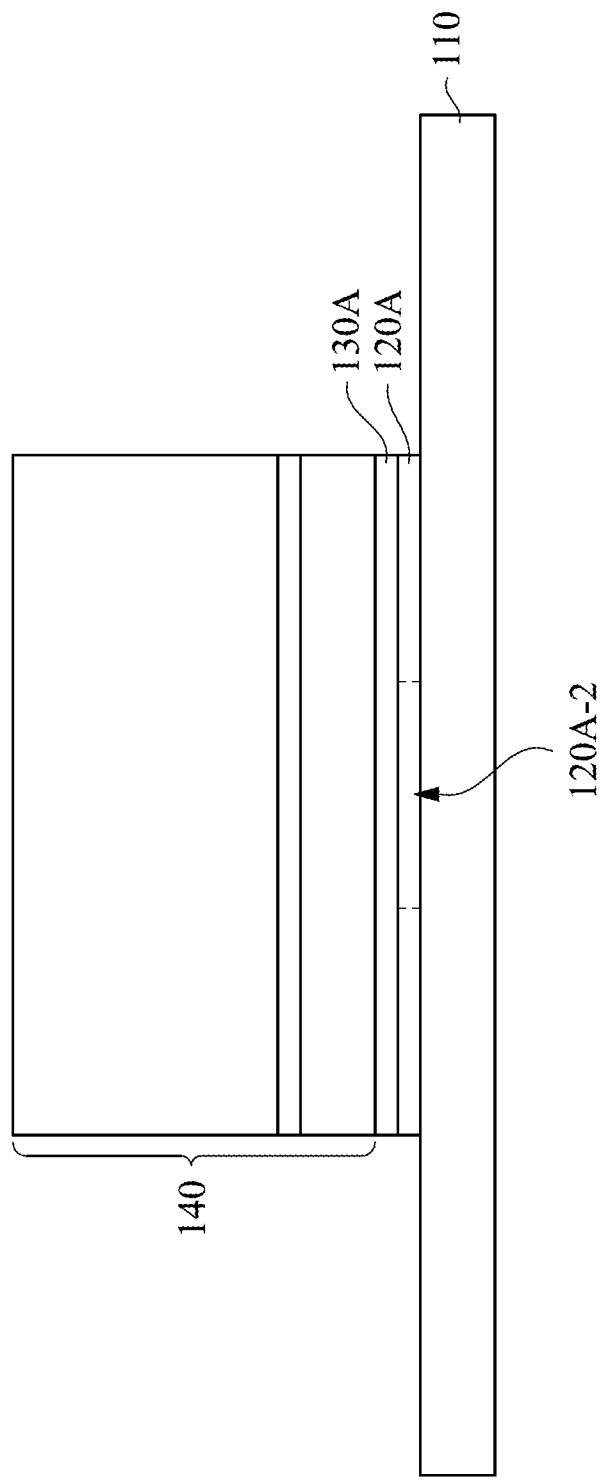
FIG. 10B is a schematic cross-sectional view of an intermediate stage of the method of forming the electrical binding structure according to some embodiments of the present disclosure.
Figure 10C:
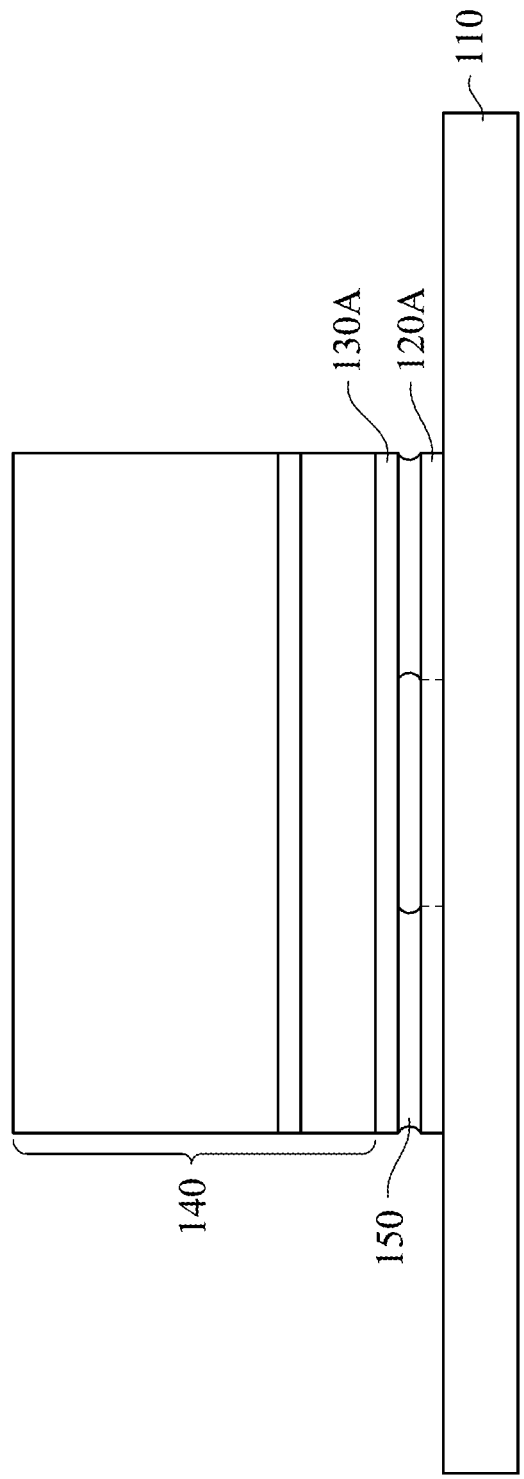
FIG. 10C is a schematic cross-sectional view of an intermediate stage of the method of forming the electrical binding structure according to some embodiments of the present disclosure.
Figure 10D:
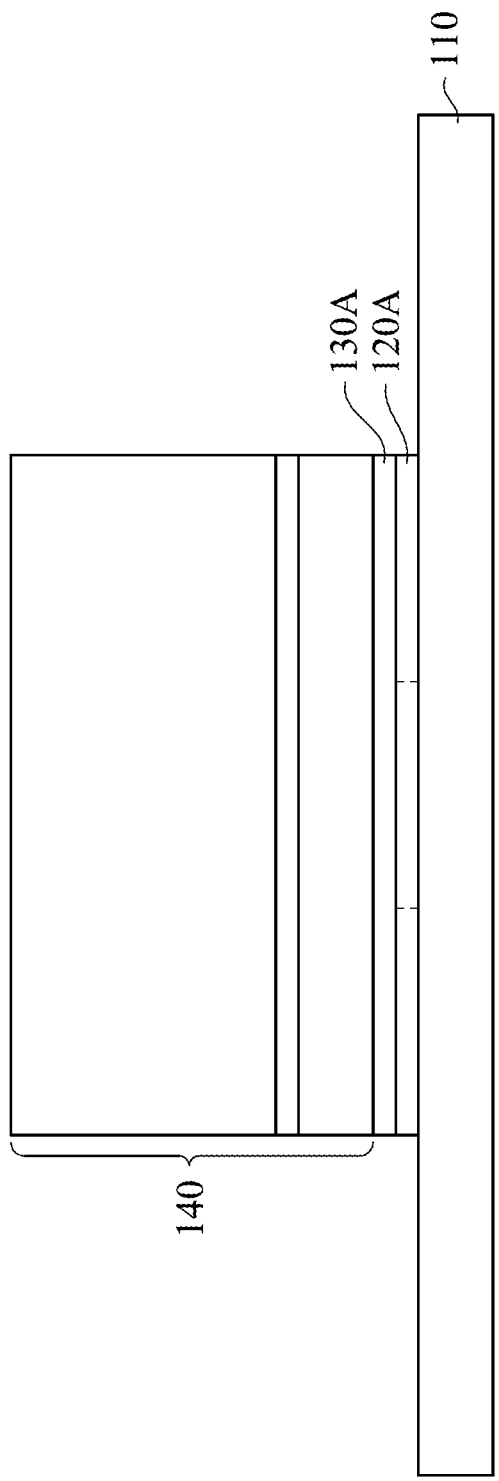
FIG. 10D is a schematic cross-sectional view of an intermediate stage of the method of forming the electrical binding structure according to some embodiments of the present disclosure.

Reference is made to FIGS. 7A, 7B, and 8. FIG. 7A is a schematic cross-sectional view of an electrical binding structure 100E according to some embodiments of the present disclosure. FIG. 7B is a bottom view of the contact pad set 120E and the electrode 130E when the electrode 130E is in proximity to or in contact with the contact pad set 120E according to some embodiments of the present disclosure. FIG. 8 is a bottom view of a contact pad set 120F and an electrode 130F when the electrode 130F is in proximity to or in contact with the contact pad set 120F according to some embodiments of the present disclosure. FIGS. 7A and 7B illustrating embodiments in which the contact pad set 120E with a shape of zigzag (or similar to zigzag). FIG. 8 illustrates embodiments in which the contact pad set 120F with a shape similar to spiral. The above embodiments demonstrate some other possible structural features which obey all the limitations as mentioned above and also capable of increasing said capillary force.

FIG. 9 is a flow chart of a method 200 of forming the electrical binding structure 100A according to some embodiments of the present disclosure. FIGS. 10A to 10D are schematic cross-sectional views of intermediate stages of the method 200 of FIG. 9. References are made to FIGS. 9 to 10D. The method 200 begins with operation 210 in which a contact pad set 120A is formed on the substrate 110 in which the contact pad set 120A includes at least one contact pad 120A-1, and the contact pad 120A-1 is conductive (as referred to FIG. 10A). In some embodiments, an adhesive layer (not shown in figures) is formed on the substrate 110 before the contact pad set 120A is formed. The method 200 continues with operation 220 in which a combination of a micro device 140 and an electrode 130A is placed on the contact pad set 120A such that opposite sides of the electrode 130A are respectively in contact with the micro device 140 and the contact pad set 120A. At least the contact pad set 120A and the electrode 130A define at least one volume space 120A-2. A vertical projection of the volume space 120A-2 projected on the substrate 110 is overlapped with a vertical projection of one of the contact pad set 120A and the electrode 130A projected on the substrate 110. In the present embodiments the vertical projection of the volume space 120A-2 projected on the substrate 110 is overlapped with the vertical projection of the electrode 130A projected on the substrate 110. Said vertical projection of the volume space 120A-2 projected on the substrate 210 is enclosed by a vertical projection of an outer periphery OP of the micro device 140 projected on the substrate 110 (as referred to FIG. 10B).

The method 200 continues with operation 230 in which a liquid layer 150 is formed between the electrode 130A and the contact pad set 120A such that the micro device 140 is gripped by a capillary force produced by the liquid layer 150. In some embodiments, the liquid layer 150 includes water. It is noted that operation 220 and operation 230 can be exchanged. In some other embodiments, the liquid layer 150 is formed on the contact pad set 120A, then the combination of the electrode 130A and the micro device 140 is placed over the contact pad set 120A such that the electrode 130A is in contact with the liquid layer 150 and is gripped by a capillary force produced by the liquid layer 150. In some embodiments, the liquid layer 150 can be formed by lowering a temperature of the contact pad set 120A in an environment including a vapor such that at least a portion of the vapor is condensed to form the liquid layer 150. In some embodiments, the liquid layer 150 is formed at a temperature about the dew point. In some embodiments, the liquid layer 150 can be formed by showering a vapor on the substrate 110 such that at least a portion of the vapor is condensed to form the liquid layer 150. In some embodiments, the vapor has a water vapor pressure higher than an ambient water vapor pressure. The vapor consists essentially of nitrogen and water. In some embodiments, a thickness of the liquid layer 150 between the electrode 130A and the contact pad set 120A is smaller than a thickness of the micro device 140 when the micro device 140 is gripped by the capillary force produced by the liquid layer 150.

The method 200 continues with operation 240 in which the liquid layer 150 is evaporated such that the electrode 130A is stuck to and bound to the contact pad set 120A and is in electrical contact with the contact pad set 120A. In some embodiments, the liquid layer 150 is evaporated by raising a temperature of the contact pad set 120A. In some embodiments, one of the contact pad set 120A and the electrode 130A includes a bonding material, and the temperature of the contact pad set 120A can be further raised to a temperature point to bond the electrode 130A to the contact pad set 120A. The temperature point can be above the melting point of the bonding material, below the melting point of the bonding material and above a boiling point of the liquid layer 150, or above a eutectic point of the contact pad set 120A and the electrode 130A. One of the contact pad set 120A and the electrode 130A may include one of copper and copper rich material. The bonding material may be a tin rich, an indium rich, or a titanium rich material. The "rich" herein means accounting for more than half of total number of atoms.

The electrical binding structures (e.g., electrical binding structures 100A, 100B, and 100E) can be described in another way which can also fulfill the increase of the capillary force for gripping the electrode (e.g., the electrodes 130A, 130A' 130B, and 130B', 130C, 130D, 130E, and 130F) to the contact pad set (e.g., the contact pad sets 120A. 120A', 120A", 120A''', 120B, 120B', 120C, 120D, 120E, and 120F) by the condition that the contact periphery CP mentioned above is greater than the primitive contact periphery PCP as mentioned above.

Figure 12:
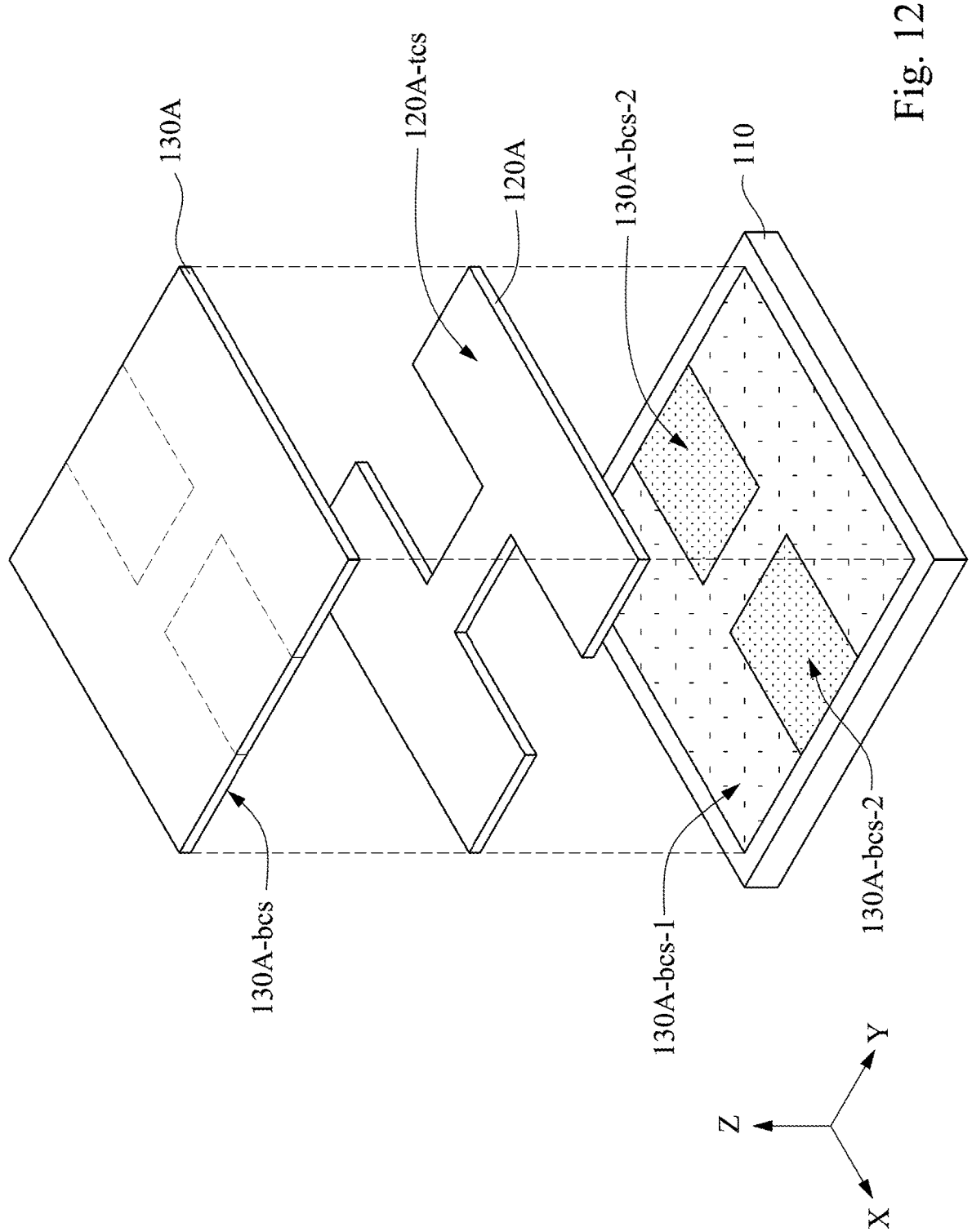
FIG. 12 is a simplified exploded view illustrating overlaps of projections between a bottom contact surface of an electrode projected on a substrate and a top contact surface of a contact pad set projected on the substrate according to some embodiments of the present disclosure.

Reference is made to FIGS. 11 to 13. FIG. 11 is a schematic exploded view illustrating the electrical binding structure 100A according to some embodiments of the present disclosure. FIG. 12 is a simplified exploded view illustrating overlaps of projections between a bottom contact surface 130A-bcs of the electrode 130A projected on the substrate 110 and a top contact surface 120A-tcs of the contact pad set 120A projected on the substrate 110 according to some embodiments of the present disclosure. FIG. 13 is cross-sectional views of the contact pad set 120A" the same as that illustrated by FIG. 3B with additional labels according to some embodiments of the present disclosure. Taking the electrical binding structure 100A as example (but should not be limited thereto), a bottom contact surface 130A-bcs of the electrode 130A is in contact with a top contact surface 120A-tcs of the contact pad set 120A in which a vertical projection of one of the bottom contact surface 130A-bcs and the top contact surface 120A-tcs projected on the substrate 110 is divided into at least one overlapped portion and at least one non-overlapped portion based on a vertical projection of another of the bottom contact surface 130A-bcs and the top contact surface 120A-tcs projected on the substrate 110. Note that in the present embodiments, it is the vertical projection of the bottom contact surface 130A-bcs of the electrode 130A being divided into the overlapped portion 130A-bcs-1 and the non-overlapped portion 130A-bcs-2 (as referred to FIG. 12).

Specifically, the overlapped portion 130A-bcs-1 is overlapped with a vertical projection of the top contact surface 120A-tcs projected on the substrate 110. The non-overlapped portion 130A-bcs-2 is not overlapped with a vertical projection of the top contact surface 120A-tcs projected on the substrate 110. The overlapped portion 130A-bcs-1 and the non-overlapped portion 130A-bcs-2 are all enclosed by a vertical projection of the outer periphery OP of the micro device 140 projected on the substrate 110, and only those enclosed by a vertical projection of the outer periphery OP of the micro device 140 projected on the substrate 110 can be regarded as the overlapped portion 130A-bcs-1 and the non-overlapped portion 130A-bcs-2. It is noted that in the embodiments where the contact pad set 120A" has a surface underneath the volume space 120A"-2, said surface is a top non-contact surface 120A"-tncs of the contact pad set 120A" since it is not in contact with the electrode 130A when the electrode 130A is in contact with the contact pad set 120A" (as shown in FIG. 13). Apparently, the top non-contact surface 120A"-tncs is different and distinguished from the top contact surface 120A"-tcs.

In some other embodiments like those illustrated by FIG. 4A, situations may be reversed (i.e., a vertical projection of a top contact surface of the contact pad set 120B on the substrate 110 is dived into an overlapped portion and a non-overlapped portion).

In summary, an electrical binding structure and a method of forming the same are provided to help a liquid layer between an electrode and a contact pad set to grip the electrode and to bind the electrode to the contact pad set. The electrical binding structure can make a contact periphery greater than a primitive contact periphery as mentioned in the description, so as to enhance a capillary force produced by the liquid layer which is used to grip the electrode.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electrical binding structure, comprising:
a substrate;
a contact pad set on the substrate, wherein the contact pad set comprises at least one contact pad, and the at least one contact pad is conductive;
a combination of a micro device and an electrode on the contact pad set, opposite sides of the electrode being respectively in contact with the micro device and the contact pad set, wherein at least the contact pad set and the electrode define at least one volume space, a total length of a contact periphery between the contact pad set and the electrode is greater than a total length of a primitive contact periphery between the contact pad set and the electrode as if the volume space is filled by the contact pad set when the contact pad set is on the same plane as the volume space, a vertical projection of the at least one volume space projected on the substrate is overlapped with a vertical projection of one of the contact pad set and the electrode projected on the substrate, and is enclosed by a vertical projection of an outer periphery of the micro device projected on the substrate.

2. The electrical binding structure of claim 1, further comprising an adhesive layer between the contact pad set and the substrate.

3. The electrical binding structure of claim 1, wherein a number of the at least one contact pad is plural.

4. The electrical binding structure of claim 1, wherein a lateral length of the micro device is less than or equal to about 100 μm.

5. The electrical binding structure of claim 1, wherein a number of the at least one volume space is plural.

6. An electrical binding structure, comprising:
a substrate;
a contact pad set on the substrate, wherein the contact pad set comprises at least one contact pad, and the at least one contact pad is conductive;
a combination of a micro device and an electrode on the contact pad set, opposite sides of the electrode being respectively in contact with the micro device and the contact pad set, a bottom contact surface of the electrode being in contact with a top contact surface of the contact pad set, wherein a vertical projection of one of the bottom contact surface and the top contact surface projected on the substrate is divided into at least one overlapped portion and at least one non-overlapped portion based on a vertical projection of another of the bottom contact surface and the top contact surface projected on the substrate, and the at least one overlapped portion and the at least one non-overlapped portion are enclosed by a vertical projection of an outer periphery of the micro device projected on the substrate, such that a total length of a contact periphery between the contact pad set and the electrode is greater than a total length of a primitive contact periphery between the contact pad set and the electrode as if the at least one non-overlapped portion is filled by the contact pad set when the contact pad set is on the same plane as the at least one non-overlapped portion.

* * * * *